US012796542B2

(12) United States Patent
Park et al.

(10) Patent No.: US 12,796,542 B2
(45) Date of Patent: Nov. 10, 2026

(54) SUBSTRATE FOR MANUFACTURING DISPLAY DEVICE INCLUDING DIELECTRIC LAYER COVERING ASSEMBLY ELECTRODES, AND METHOD FOR MANUFACTURING DISPLAY DEVICE BY USING SAME

(71) Applicant: LG ELECTRONICS INC., Seoul (KR)

(72) Inventors: Changseo Park, Seoul (KR); Jinhyung Lee, Seoul (KR); Younho Heo, Seoul (KR); Yongil Shin, Seoul (KR); Kisu Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 567 days.

(21) Appl. No.: 18/020,608

(22) PCT Filed: Aug. 10, 2020

(86) PCT No.: PCT/KR2020/010530
§ 371 (c)(1),
(2) Date: Feb. 9, 2023

(87) PCT Pub. No.: WO2022/034932
PCT Pub. Date: Feb. 17, 2022

(65) Prior Publication Data

US 2023/0299055 A1 Sep. 21, 2023

(51) Int. Cl.
*H10H 20/01* (2025.01)
*H10H 20/813* (2025.01)
(Continued)

(52) U.S. Cl.
CPC ............ *H10W 90/00* (2026.01); *H10H 20/01* (2025.01); *H10H 20/813* (2025.01); *H10H 20/83* (2025.01); *H10P 52/00* (2026.01)

(58) Field of Classification Search
CPC ............. H01L 25/0753; H01L 21/3043; H01L 2221/68354; H01L 21/6835; H01L 25/167;
(Continued)

(56) References Cited

U.S. PATENT DOCUMENTS 5,880,019 A * 3/1999 Hsieh ................ H01L 21/76804
257/E21.507
6,309,976 B1 * 10/2001 Lin ........................... G03F 1/68
438/725
(Continued)

FOREIGN PATENT DOCUMENTS

KR 1020000051678 8/2000
KR 1020070068919 7/2007
(Continued)

OTHER PUBLICATIONS

PCT International Application No. PCT/KR2020/010530, International Search Report dated May 6, 2021, 4 pages.
(Continued)

*Primary Examiner* — Duy T Nguyen
(74) *Attorney, Agent, or Firm* — LEE, HONG, DEGERMAN, KANG & WAIMEY

(57) ABSTRACT

A method for manufacturing a substrate for manufacturing a display device, according to the present invention, comprises the steps of: (a) forming, at predetermined intervals, assembly electrodes extending in one direction on a base part, and forming a dielectric layer so as to cover the assembly electrodes; (b) forming, on the dielectric layer, metal patterns so as to overlap the assembly electrodes; (c) forming partition parts on the dielectric layer so as to cover the metal patterns, and then forming assembly holes so as to overlap the metal patterns; and (d) removing the metal patterns exposed through the assembly holes, wherein, in step (d), a groove part is formed on the surface of each
(Continued)

partition part, which forms the inner surface of each assembly hole, as the metal patterns are removed.

7 Claims, 19 Drawing Sheets

(51) Int. Cl.
*H10H 20/83* (2025.01)
*H10P 52/00* (2026.01)
*H10W 90/00* (2026.01)

(58) Field of Classification Search
CPC ..................... H01L 23/13; H01L 23/14; H01L 2221/68313; H01L 2221/68368; H10H 20/01; H10H 20/813; H10H 20/83; H10H 20/0364; H10H 20/857; H10H 20/8506; H10W 90/00; H10W 70/68; H10W 70/69; H10P 52/00; H10P 72/74; H10P 72/7428; H10P 72/741; H10P 72/7434
USPC .......................................................... 438/455
See application file for complete search history.

(56) References Cited

U.S. PATENT DOCUMENTS

| | | | | |
|---|---|---|---|---|
| 6,531,382 | B1 * | 3/2003 | Cheng | H01L 21/76802<br>257/E21.582 |
| 7,049,035 | B2 * | 5/2006 | Kindt | C25D 21/12<br>430/5 |
| 2005/0068608 | A1 * | 3/2005 | Campbell | C23F 4/00<br>438/49 |
| 2007/0026683 | A1 * | 2/2007 | Chen | H10W 20/076<br>438/782 |
| 2007/0066074 | A1 * | 3/2007 | Rossi | H10P 50/283<br>257/E21.549 |
| 2022/0367774 | A1 * | 11/2022 | Kim | H01L 25/0753 |

FOREIGN PATENT DOCUMENTS

| | | |
|---|---|---|
| KR | 1020080102496 | 11/2008 |
| KR | 1020110129620 | 12/2011 |
| KR | 1020150045331 | 4/2015 |
| KR | 1020160005295 | 1/2016 |
| KR | 20190075869 A * | 7/2019 |
| KR | 1020190075869 | 7/2019 |
| KR | 1020200023316 | 3/2020 |
| KR | 1020200023317 | 3/2020 |
| KR | 1020200023328 | 3/2020 |
| KR | 1020200026676 | 3/2020 |

OTHER PUBLICATIONS

Korean Intellectual Property Office Application No. 10-2022-7045050, Notice of Allowance dated Mar. 21, 2025, 7 pages.

Korean Intellectual Property Office Application No. 10-2022-7045050, Office Action dated Jul. 17, 2024, 7 pages.

* cited by examiner

SUBSTRATE FOR MANUFACTURING DISPLAY DEVICE INCLUDING DIELECTRIC LAYER COVERING ASSEMBLY ELECTRODES, AND METHOD FOR MANUFACTURING DISPLAY DEVICE BY USING SAME

CROSS-REFERENCE TO RELATED APPLICATIONS

This application is the National Stage filing under 35 U.S.C. 371 of International Application No. PCT/KR2020/010530, filed on Aug. 10, 2020, the contents of which are all incorporated by reference herein in their entirety.

TECHNICAL FIELD

The present disclosure relates to a substrate used for manufacturing a display device that uses semiconductor light-emitting elements, specifically, semiconductor light-emitting elements with sizes of several to several tens of μm, and a method for manufacturing the substrate.

BACKGROUND ART

In recent years, in the field of display technology, liquid-crystal displays (LCDs), organic light-emitting diodes (OLED) displays, semiconductor light-emitting displays, etc. have been competing to realize large-area displays.

Semiconductor light-emitting devices (elements, diodes) (hereinafter, microLEDs) with a cross-sectional area of 100 μm, when used in displays, may offer very high efficiency because the displays do not need a polarizer to absorb light. However, in order to implement large-scale displays, several millions of semiconductor light-emitting devices (elements) are required, which makes it difficult to transfer the semiconductor light-emitting devices, compared to other technologies.

In recent years, microLEDs can be transferred by pick & place, laser lift-off or self-assembly. Among others, the self-assembly approach is a method that allows semiconductor light-emitting devices to find their positions on their own in a fluid, which is most advantageous in realizing large-screen display devices.

Self-assembly methods may include a method of directly assembling semiconductor light-emitting devices on a final substrate to be used in a product, and a method of assembling semiconductor light-emitting devices on an assembly substrate and transferring the semiconductor light-emitting devices to a final substrate through an additional transfer process. The direct transfer method is efficient in terms of process, and the hybrid-transfer method is advantageous in terms of additionally using a structure for self-assembly without limitation. Therefore, the two methods are selectively used.

DISCLOSURE OF INVENTION

Technical Problem

One aspect of the present disclosure is to provide a structure of an assembly substrate used in a hybrid type and a method for manufacturing the assembly substrate.

Another aspect of the present disclosure is to provide a method for manufacturing an assembly substrate to be reusable and an assembly substrate manufactured by the method.

Solution to Problem

A substrate for manufacturing a display device according to the present disclosure may include a base, assembly electrodes extending in one direction and disposed at predetermined gaps on one surface of the base, a dielectric layer disposed on the base to cover the assembly electrodes, and a barrier rib stacked on the dielectric layer while forming assembly holes, in which semiconductor light-emitting elements are seated, to overlap the assembly electrodes, and wherein the barrier rib may include grooves formed in a surface defining inner surfaces of the assembly holes.

In the present disclosure, each of the grooves may be formed in a bottom surface of the assembly hole.

In the present disclosure, the groove may be formed with a predetermined width along a circumference of the assembly hole.

In the present disclosure, each of the grooves may be formed to have a thickness of 20 nm to 200 nm from a bottom surface of the assembly hole.

In the present disclosure, the barrier rib may be formed of SiO2 or SiNx.

A method of manufacturing a substrate for manufacturing a display device according to the present disclosure may include (a) forming assembly electrodes extending in one direction on a base at predetermined distances, and forming a dielectric layer to cover the assembly electrodes, (b) forming metal patterns on the dielectric layer to overlap the assembly electrodes, (c) forming a barrier rib on the dielectric layer to cover the metal patterns, and then forming assembly holes to overlap the metal patterns, and (d) removing the metal patterns exposed through the assembly holes, wherein in the step (d), the metal patterns may be removed such that the grooves are formed in a surface of the barrier rib defining inner surfaces of the assembly holes.

According to the present disclosure, each of the metal patterns may share a center with the assembly hole, and the metal pattern may be formed to have an area wider than that of the assembly hole.

In the present disclosure, each of the grooves may be formed with a predetermined width along a circumference of the assembly hole.

In the present disclosure, each of the metal patterns may be formed with a thickness of 20 nm to 200 nm on the dielectric layer.

In the present disclosure, the barrier rib may be formed of SiO2 or SiNx, and in the step (c), and in step (b), the barrier rib may be etched using a CFx-based etching gas to form the assembly holes.

In the present disclosure, the metal pattern may be formed of a metal material having an etching selectivity of 10:1 or more with to the barrier rib for the CFx-based etching gas.

In the present disclosure, in step (d), the metal pattern may be removed through dry etching using a $Cl_2$-based etching gas or wet etching.

Advantageous Effects of Invention

According to the present disclosure, since assembly electrodes and a dielectric layer of a substrate for manufacturing a display device are protected during a manufacturing process, reuse of the substrate can be allowed, thereby securing mass productivity and cost competitiveness.

In addition, according to the present disclosure, since the assembly electrodes and the dielectric layer of the substrate for manufacturing a display device are protected during the manufacturing process, distortion of an electric field can be minimized during self-assembly, and thus an assembly rate of semiconductor light-emitting elements can be improved.

MODE FOR THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. Furthermore, it will be understood that when an element such as a layer, region or substrate is referred to as being "on" another element, it can be directly on the another element or an intermediate element may also be interposed therebetween.

A display device disclosed herein may include a portable (mobile) phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, the configuration according to the implementation described herein can be applied as long as it can include a display even in a new product form to be developed later.

Figure 1:
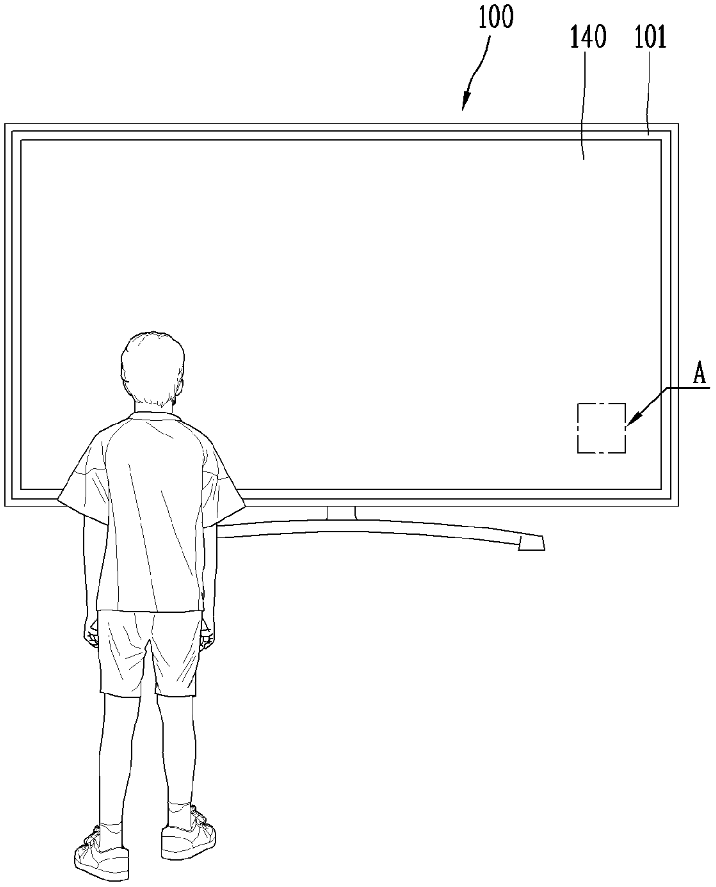
FIG. 1 is a conceptual view illustrating one embodiment of a display device using semiconductor light-emitting elements.
Figure 2:
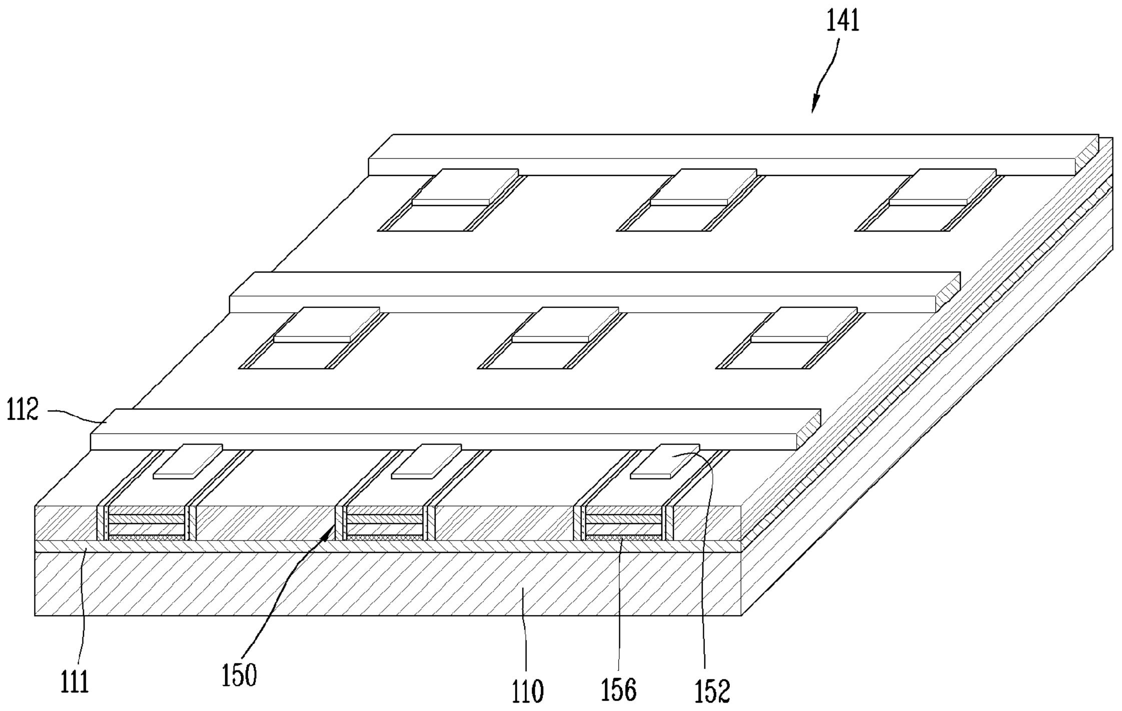
FIG. 2 is a partial enlarged view of a portion A in the display device of FIG. 1.
Figure 3:
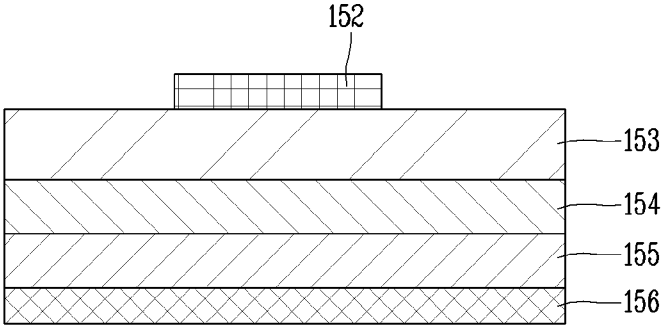
FIG. 3 is an enlarged view of the semiconductor light-emitting element of FIG. 2.
Figure 4:
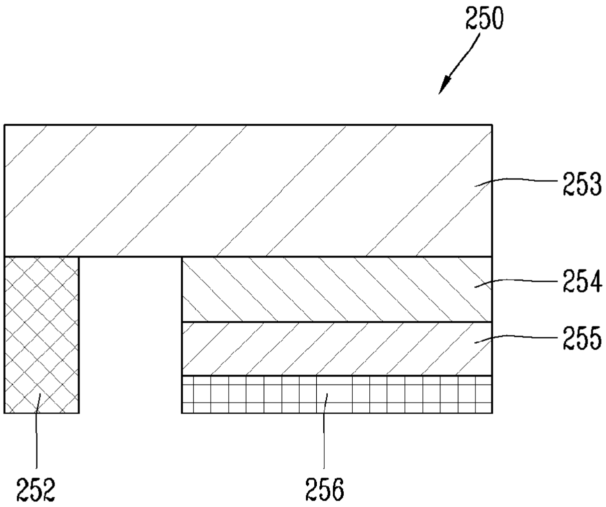
FIG. 4 is a view illustrating another embodiment of the semiconductor light-emitting element of FIG. 2.

FIG. 1 is a conceptual view illustrating one embodiment of a display device using semiconductor light-emitting elements, FIG. 2 is a partial enlarged view of a portion A in the display device of FIG. 1, FIG. 3 is an enlarged view of the semiconductor light-emitting element of FIG. 2, and FIG. 4 is a view illustrating another embodiment of the semiconductor light-emitting element of FIG. 2.

As illustrated, information processed by a controller of a display device 100 may be output on a display module 140. A closed loop-shaped case 101 that runs around the rim of the display module 140 may define the bezel of the display device 100.

The display module 140 may include a panel 141 that displays an image, and the panel 141 may include micro-sized semiconductor light-emitting elements (or diodes) 150 and a wiring substrate 110 where the semiconductor light-emitting elements 150 are mounted.

The wiring substrate 110 may be provided with wirings, which can be connected to n-type electrodes 152 and p-type electrodes 156 of the semiconductor light-emitting elements 150. As such, the semiconductor light-emitting elements 150 may be provided on the wiring substrate 110 as individual pixels that emit light on their own.

The image displayed on the panel 141 may be visual information, which is rendered by controlling the light emission of unit pixels arranged in a matrix configuration independently through the wirings.

The present disclosure takes microLEDs (light-emitting elements) as an example of the semiconductor light-emitting elements 150 which convert current into light. The microLEDs may be light-emitting elements that are small in size less than 100 μm. The semiconductor light-emitting elements 150 may have light-emitting regions of red, green, and blue, and unit pixels may be produced by combinations of these colors. That is, the unit pixels are the smallest units for producing one color. Each unit pixel may contain at least three microLEDs.

More specifically, referring to FIG. 3, the semiconductor light-emitting element 150 may have a vertical structure.

For example, the semiconductor light-emitting elements 150 may be implemented as high-power light-emitting elements that are composed mostly of gallium nitride (GaN), with some indium (In) and/or aluminum (Al) added to it, and emit light of various colors.

Such a vertical semiconductor light-emitting element may include a p-type electrode 156, a p-type semiconductor layer

155 disposed on the p-type semiconductor layer 156, an active layer 154 disposed on the p-type semiconductor layer 155, an n-type semiconductor layer 153 disposed on the active layer 154, and an n-type electrode 152 disposed on the n-type semiconductor layer 153. In this case, the p-type electrode 156 at the bottom may be electrically connected to a p-electrode 111 of the wiring substrate, and the upper n-type electrode 152 at the top may be electrically connected to an n-electrode 112 above the semiconductor light-emitting element. The electrodes can be disposed in an upward/downward direction in the vertical semiconductor light-emitting element 150, thereby providing a great advantage of reducing a chip size.

In another example, referring to FIG. 4, the semiconductor light-emitting elements may be flip chip-type light-emitting elements.

As an example of such a flip chip-type light-emitting element, the semiconductor light-emitting element 250 may include a p-type electrode 256, a p-type semiconductor layer 255 disposed on the p-type layer 256, an active layer 254 disposed on the p-type semiconductor layer 255, an n-type semiconductor layer 253 disposed on the active layer 254, and an n-type electrode 252 vertically separated from the p-type electrode 256 on the n-type semiconductor layer 253. In this case, both the p-type electrode 256 and the n-type electrode 252 may be electrically connected to a p electrode and an n electrode of the wiring substrate, below the semiconductor light-emitting element.

The vertical semiconductor light-emitting element and a flip-type light-emitting element each may be used as a green semiconductor light-emitting element, blue semiconductor light-emitting element, or red semiconductor light-emitting element. The green semiconductor light-emitting element and the blue semiconductor light-emitting element may be implemented as high-power light-emitting elements that are composed mostly of gallium nitride (GaN), with some indium (In) and/or aluminum (Al) added to it, and emit green and blue light, respectively. As an example, the semiconductor light-emitting elements may be made of gallium nitride thin films which include various layers of n-Gan, p-GaN, AlGaN, InGaN, etc. More specifically, the p-type semiconductor layer may be P-type GaN, and the n-type semiconductor layer may be N-type GaN. However, for the red semiconductor light-emitting element, the p-type semiconductor layer may be P-type GaAs, and the n-type semiconductor layer may be N-type GaAs.

Moreover, the p-type semiconductor layer may be P-type GaN doped with Mg on the p electrode, and the n-type semiconductor layer may be N-type GaN doped with Si on the n electrode. In this case, the above-described semiconductor light-emitting elements may be semiconductor light-emitting elements without the active layer.

In some examples, referring to FIGS. 1 to 4, because of the very small size of the light-emitting elements, self-emissive, high-definition unit pixels may be arranged on the display panel, and therefore the display device can deliver high picture quality.

In the display device using the semiconductor light-emitting elements, semiconductor light-emitting elements may be grown on a wafer, formed through mesa and isolation, and used as individual pixels. The micro-sized semiconductor light-emitting elements 150 should be transferred onto preset positions on a substrate of the display panel. One of the transfer technologies available may be pick and place, but it has a low success rate and requires a lot of time. In another example, a number of diodes may be transferred at a time by using a stamp or roll, which, however, is not suitable for large-screen displays because of limited yields. The present disclosure proposes a new method and device for manufacturing a display device that can solve these problems.

To this end, a new method for manufacturing a display device will be described first below. FIGS. 5A to 5E are conceptual views illustrating a new process for manufacturing the semiconductor light-emitting elements (or diodes).

In this specification, a display device using passive matrix (PM) semiconductor light-emitting elements will be illustrated. It should be noted that the illustration given below is also applied to active matrix (AM) semiconductor light-emitting elements. In addition, the self-assembly method described in this specification can be applied to both horizontal semiconductor light-emitting elements and vertical semiconductor light-emitting elements.

Figure 5A:
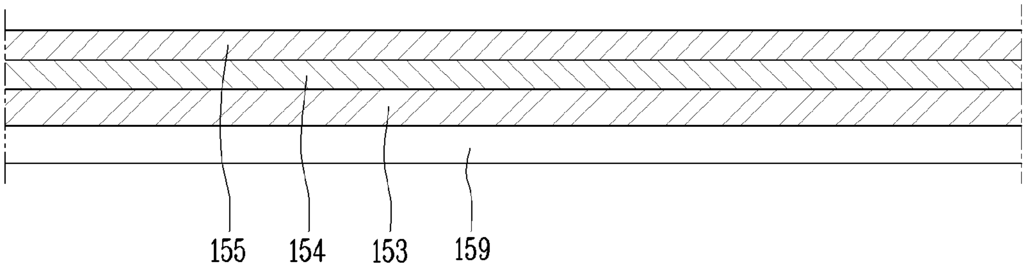
FIGS. 5A to 5E are conceptual diagrams illustrating a new process for manufacturing a semiconductor light-emitting element.

First of all, according to the manufacturing method of the display device, a first conductive semiconductor layer 153, an active layer 154, and a second conductive semiconductor layer 155 are grown on a growth substrate 159 (FIG. 5A).

Once the first conductive semiconductor layer 153 is grown, the active layer 154 may be grown on the first conductive semiconductor layer 153 and then the second conductive semiconductor layer 155 may be grown on the active layer 154. By sequentially growing the first conductive semiconductor layer 153, the active layer 154, and the second conductive semiconductor layer 155, the first conductive semiconductor layer 153, the active layer 154, and the second conductive semiconductor layer 155 may form a stack structure as illustrated in FIG. 5A.

In this case, the first conductive semiconductor layer 153 may be a n-type semiconductor layer, and the second conductive semiconductor layer 155 may be a p-type semiconductor layer. However, the present disclosure is not necessarily limited to this, and the first conductive type may be p-type and the second conductive type may be n-type.

Moreover, although this exemplary implementation is illustrated by assuming the presence of the active layer, the active layer may be omitted if necessary, as stated above. In an example, the p-type semiconductor layer may be P-type GaN doped with Mg, and the n-type semiconductor layer may be N-type GaN doped with Si on the n electrode.

The growth substrate 159 (wafer) may be formed of, but not limited to, light-transmissive material, for example, one of sapphire (Al2O3), GaN, ZnO, and AlO. Also, the growth substrate 159 may be made of a material suitable for growing semiconductor materials, namely, a carrier wafer. The growth substrate 2101 may also be formed of a material having high thermal conductivity. The growth substrate 2101 may use at least one of a SiC substrate having higher thermal conductivity than the sapphire (Al2O3) substrate, Si, GaAs, GaP, InP and Ga2O3, in addition to a conductive substrate or an insulating substrate.

Figure 5B:
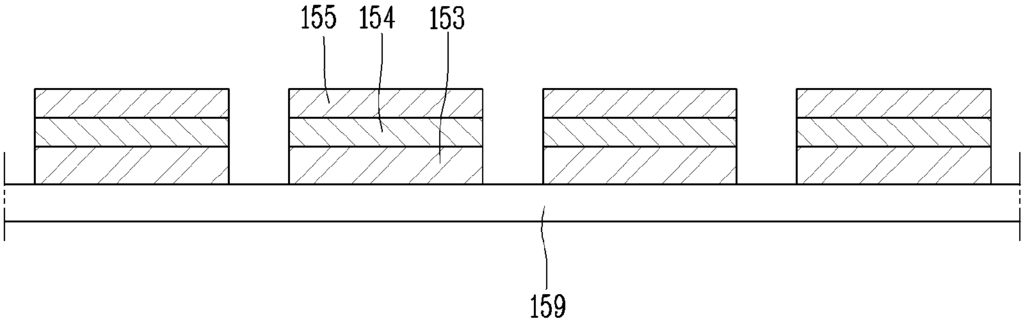

Next, a plurality of semiconductor light-emitting elements may be formed by removing at least parts of the first conductive semiconductor layer 153, the active layer 154, and the second conductive semiconductor layer 155 (FIG. 5B).

More specifically, isolation may be performed so that the plurality of light-emitting elements form a light-emitting element array. That is, a plurality of semiconductor light-emitting elements may be formed by vertically etching the first conductive semiconductor layer 153, the active layer 154, and the second conductive semiconductor layer 155.

In the case of horizontal semiconductor light-emitting elements, a mesa process may be performed which exposes the first conductive semiconductor layer 153 to the outside by vertically removing part of the active layer 154 and the second conductive semiconductor layer 155, and then isolation may be performed which forms an array of semiconductor light-emitting elements by etching the first conductive semiconductor layer 153.

Figure 5C:
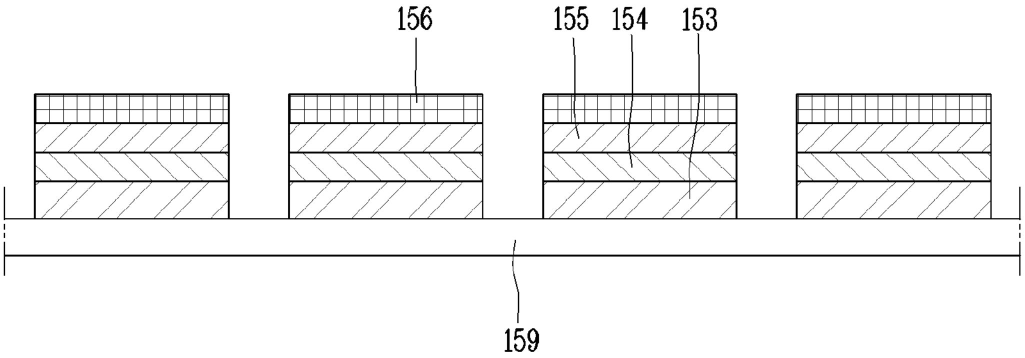

Next, a second conductive electrode 156 (or p-type electrode) may be formed on one surface of the second conductive semiconductor layer 155 (FIG. 5C). The second conductive electrode 156 may be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 may serve as an n-type electrode.

Figure 5D:
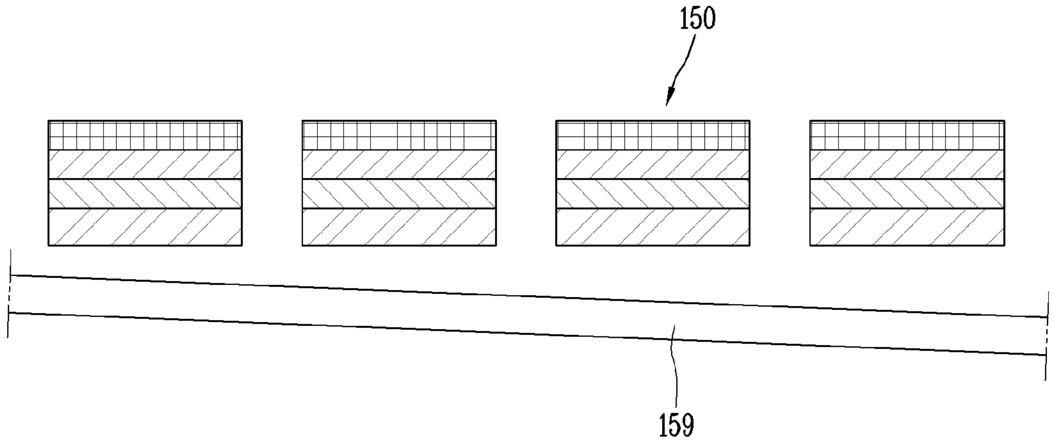

Next, the growth substrate 159 may be removed, thus leaving a plurality of semiconductor light-emitting elements. For example, the growth substrate 159 may be removed using laser lift-off (LLO) or chemical lift-off (CLO) (FIG. 5D).

Figure 5E:
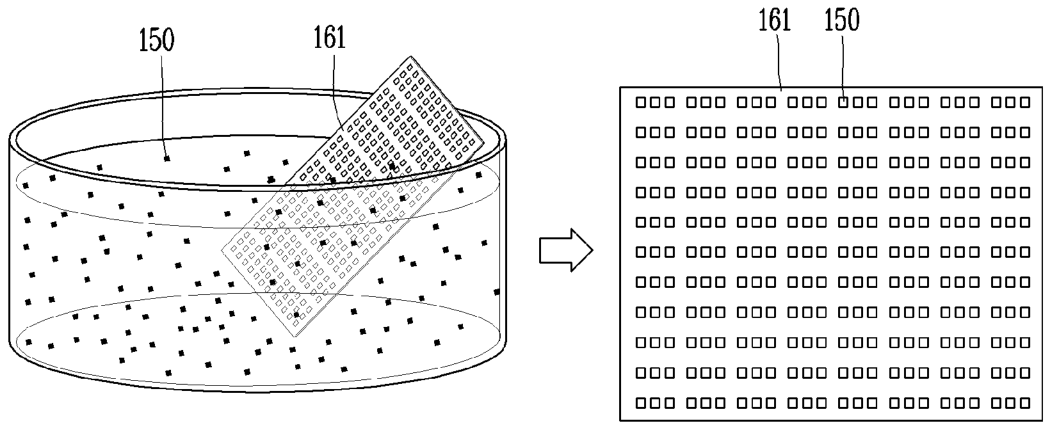

Afterwards, the step of mounting the semiconductor light-emitting elements 150 on a substrate in a chamber filled with a fluid may be performed (FIG. 5E).

For example, the semiconductor light-emitting elements 150 and the substrate 161 may be put into a chamber filled with a fluid, and the semiconductor light-emitting elements may be self-assembled onto the substrate 161 using fluidity, gravity, surface tension, etc. In this case, the substrate may be an assembly substrate 161.

In another example, a wiring substrate, instead of the assembly substrate 161, may be put into a fluid chamber, and the semiconductor light-emitting elements 150 may be mounted directly onto the wiring substrate. In this case, the substrate may be a wiring substrate. For convenience of explanation, the present disclosure is illustrated with an example in which the semiconductor light-emitting elements 150 are mounted onto the assembly substrate 161.

To facilitate the mounting of the semiconductor light-emitting elements 150 onto the assembly substrate 161, cells (not shown) into which the semiconductor light-emitting elements 150 are fitted may be provided on the assembly substrate 161. Specifically, cells where the semiconductor light-emitting elements 150 are mounted may be disposed on the assembly substrate 161 at positions where the semiconductor light-emitting elements 150 are aligned with wiring electrodes. The semiconductor light-emitting elements 150 may be assembled to the cells as they move within the fluid.

After arraying the semiconductor light-emitting elements 150 on the assembly substrate 161, the semiconductor light-emitting elements 150 may be transferred to the wiring substrate from the assembly substrate 161, thereby enabling a large-area transfer across a large area. Thus, the assembly substrate 161 may be referred to as a temporary substrate.

Meanwhile, the above-explained self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material may be placed on the semiconductor light-emitting elements so that the semiconductor light-emitting elements are moved by magnetic force, and the semiconductor light-emitting elements may be mounted at preset positions by an electric field in the process of being moved. This transfer method and device will be described in more detail below with reference to the accompanying drawings.

Figure 6:
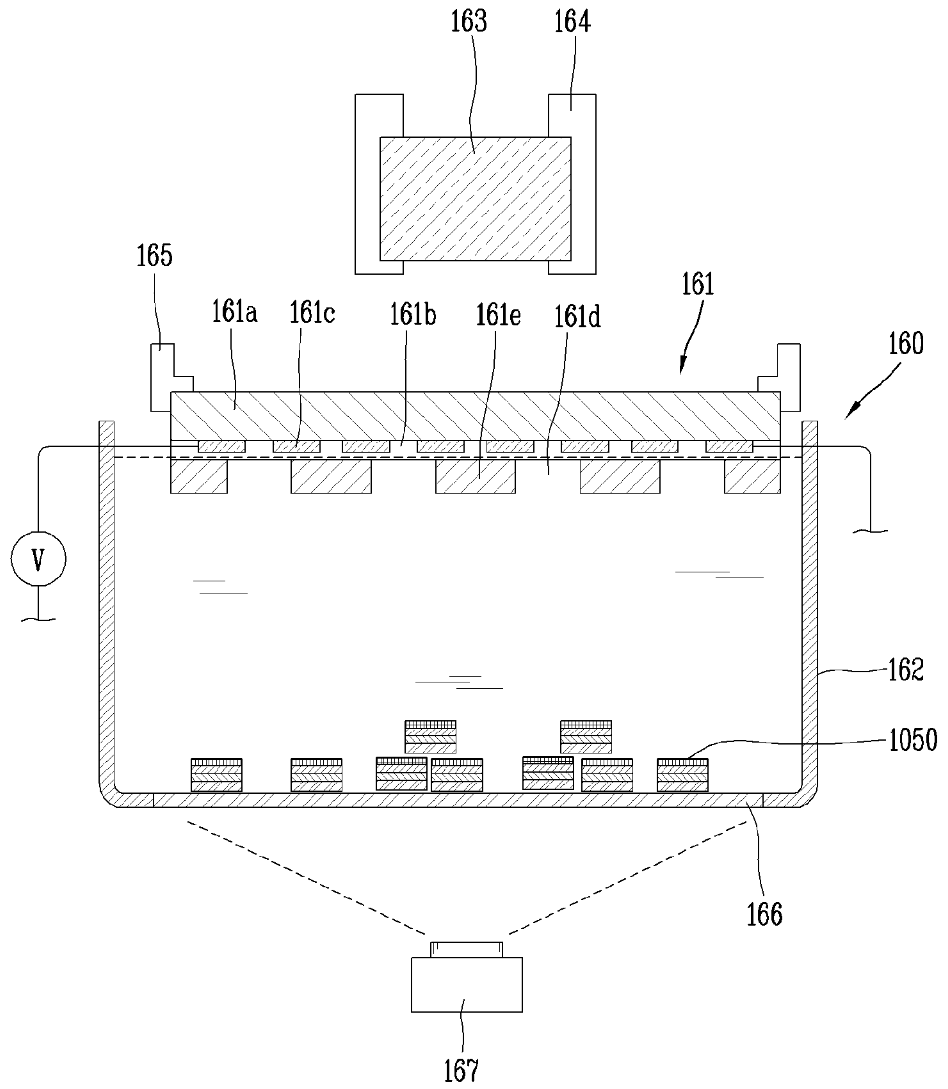
FIG. 6 is a conceptual diagram illustrating one embodiment of a device for self-assembling semiconductor light-emitting elements according to the present disclosure.
Figure 7:
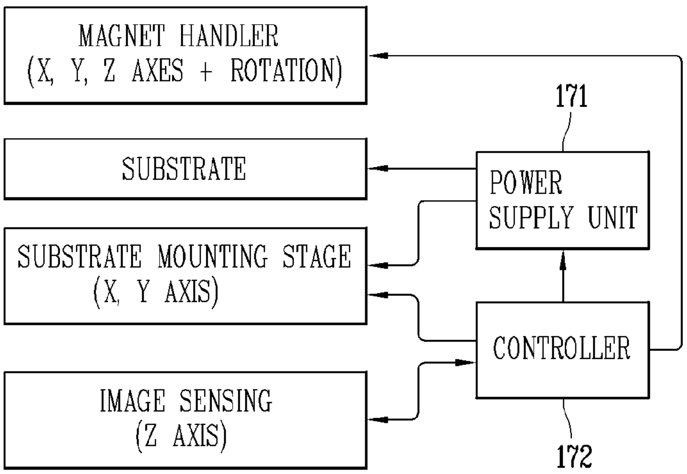
FIG. 7 is a block diagram of the self-assembly device of FIG. 6.

FIG. 6 is a conceptual diagram illustrating an example of a device for self-assembling semiconductor light-emitting elements and FIG. 7 is a block diagram of the self-assembly device of FIG. 6. FIGS. 8A to 8E are conceptual view illustrating a process for self-assembling semiconductor light-emitting elements using the self-assembly device of FIG. 6 and FIG. 9 is a conceptual view illustrating the semiconductor light-emitting element of FIGS. 8A to 8E.

Referring to FIGS. 6 and 7, the self-assembly device 160 may include a fluid chamber 162, a magnet 163, and a position controller 164.

The fluid chamber 162 may define a space for receiving a plurality of semiconductor light-emitting elements. The space may be filled with a fluid, and the fluid may be an assembly solution, which includes water or the like. Thus, the fluid chamber 162 may be a water tank and configured as an open-type. However, the present disclosure is not limited to this, and the fluid chamber 162 may be a closed-type chamber in which the space is in a closed state.

A substrate 161 may be placed in the fluid chamber 162 so that an assembly surface where the semiconductor light-emitting elements 150 are assembled faces downwards. For example, the substrate 161 may be fed to an assembly site by a feed unit (transfer unit), and the transfer unit may include a stage 165 where the substrate is mounted. The position of the stage 165 may be adjusted by the controller, whereby the substrate 161 can be fed to the assembly site.

In this instance, the assembly surface of the substrate 161 at the assembly site may face the bottom of the fluid chamber 162. As illustrated in the drawings, the assembly surface of the substrate 161 may be placed to be soaked with the fluid in the fluid chamber 162. Thus, the semiconductor light-emitting elements 150 in the fluid may be moved to the assembly surface.

The substrate 161 may be an assembly substrate where an electric field can be formed, and may include a base portion 161*a*, a dielectric layer 161*b*, and a plurality of electrodes 161*c*.

The base portion 161*a* may be made of an insulating material, and the plurality of electrodes 161*c* may be thin-film or thick-film bi-planar electrodes that are patterned on one surface of the base portion 161*a*. The electrodes 161*c* may be formed of a stack of Ti/Cu/Ti, Ag paste, ITO, etc.

The dielectric layer 161*b* may be made of an inorganic material such as SiO2, SiNx, SiON, Al2O3, TiO2, HfO2, etc. Alternatively, the dielectric layer 161*b* may be an organic insulator and configured as a single layer or multi-layers. The thickness of the dielectric layer 161*b* may range from several tens of nm to several μm.

Further, the substrate 161 according to the present disclosure includes a plurality of cells 161*d* that are separated by barrier walls. The cells 161*d* may be sequentially arranged in one direction and made of a polymer material. Furthermore, the barrier walls 161*e* defining the cells 161*d* may be made to be shared with neighboring cells 161*d*. The barrier walls 161*e* may protrude from the base portion 161*a*, and the cells 161*d* may be sequentially arranged in one direction by the barrier walls 161*e*. More specifically, the cells 161*d* may be sequentially arranged in column and row directions and have a matrix configuration.

As illustrated in the drawings, the cells 161*d* may have recesses for receiving the semiconductor light-emitting elements 150, and the recesses may be spaces defined by the barrier walls 161*e*. The recesses may have a shape identical or similar to the shape of the semiconductor light-emitting elements. For example, if the semiconductor light-emitting elements are rectangular, the recesses may be rectangular too. Moreover, although not shown, the recesses formed in the cells may be circular if the semiconductor light-emitting elements are circular. Moreover, each of the cells is configured to accommodate a single semiconductor light-emitting element. In other words, a single semiconductor light-emitting element is accommodated in a single cell.

Meanwhile, the plurality of electrodes 161*c* may have a plurality of electrode lines that are placed on bottoms of the cells 161*d*, and the plurality of electrode lines may extend to neighboring cells.

The plurality of electrodes 161*c* may be placed beneath the cells 161*d*, and different polarities may be applied to create an electric field within the cells 161*d*. To form an electric field, the dielectric layer 161*b* may form the bottom of the cells 161*d* while covering the electrodes 161*c*. With this structure, when different polarities are applied to a pair of electrodes 161*c* beneath each cell 161*d*, an electric field may be formed and the semiconductor light-emitting elements can be inserted into the cells 161*d* by the electric field.

The electrodes of the substrate 161 at the assembly site may be electrically connected to a power supply 171. The power supply unit 171 may perform the function of generating the electric field by applying power to the electrodes.

As shown in the drawings, the self-assembly device may have the magnet 163 for applying magnetic force to the semiconductor light-emitting elements. The magnet 163 may be disposed at a distance from the fluid chamber 162 to apply magnetic force to the semiconductor light-emitting elements 150. The magnet 163 may be disposed to face an opposite side of the assembly surface of the substrate 161, and the position of the magnet 163 may be controlled by the position controller 164 connected to the magnet 163.

The semiconductor light-emitting elements 1050 may have a magnetic material so that they can be moved within the fluid by a magnetic field.

Referring to FIG. 9, a semiconductor light-emitting element having a magnetic material may include a first conductive electrode 1052, a second conductive electrode 1056, a first conductive semiconductor layer 1053 on which the first conductive electrode 1052 is disposed, a second conductive semiconductor layer 1055 which overlaps the first conductive semiconductor layer 1052 and on which the second conductive electrode 1056 is disposed, and an active layer 1054 disposed between the first and second conductive semiconductor layers 1053 and 1055.

Here, the first conductive may refer to p-type, and the second conductive type may refer to n-type, or vice versa. As stated previously, the semiconductor light-emitting element may be formed without the active layer.

Meanwhile, the first conductive electrode 1052 may be formed after the semiconductor light-emitting element is assembled onto the wiring substrate by the self-assembling of the semiconductor light-emitting element. Further, the second conductive electrode 1056 may include a magnetic material. The magnetic material may refer a magnetic metal. The magnetic material may be Ni, SmCo, etc. In another example, the magnetic material may include at least one of Gd-based, La-based, and Mn-based materials.

The magnetic material may be provided in the form of particles on the second conductive electrode 1056. Alternatively, one layer of a conductive electrode including a magnetic material may be made of the magnetic material. As an example, the second conductive electrode 1056 of the semiconductor light-emitting element 1050 may include a first layer 1056*a* and a second layer 1056*b*, as illustrated in FIG. 9. Here, the first layer 1056*a* may include a magnetic material, and the second layer 1056*b* may include a metal material other than the magnetic material.

As illustrated in the drawing, in this example, the first layer 1056*a* including the magnetic material may be disposed in contact with the second conductive semiconductor layer 1055. In this case, the first layer 1056*a* may be disposed between the second layer 1056*b* and the second conductive semiconductor layer 1055. The second layer 1056*b* may be a contact metal that is connected to the second electrode on the wiring substrate. However, the present disclosure is not necessarily limited to this, and the magnetic material may be disposed on one surface of the first conductive semiconductor layer.

Still referring to FIGS. 6 and 7, more specifically, on top of the fluid chamber of the self-assembly device, a magnet handler capable of automatically or manually moving the magnet 163 on the x, y, and z axes or a motor capable of rotating the magnet 163 may be provided. The magnet handler and motor may constitute the position controller 164. As such, the magnet 163 may rotate in a horizontal, clockwise, or counterclockwise direction with respect to the substrate 161.

Meanwhile, the fluid chamber 162 may be provided with a light-transmissive bottom plate 166, and the semiconductor light-emitting elements may be disposed between the bottom plate 166 and the substrate 161. An image sensor 167 may be disposed to face the bottom plate 166 so as to monitor the inside of the fluid chamber 162 through the bottom plate 166. The image sensor 167 may be controlled by a controller 172, and may include an inverted-type lens, CCD, etc. so as to observe the assembly surface of the substrate 161.

The self-assembly device may be configured to use a magnetic field and an electric field in combination. With this, the semiconductor light-emitting elements can be mounted at preset positions on the substrate by the electric field while being moved by changes in the position of the magnet. Hereinafter, the assembly process using the self-assembly device will be described in more detail.

First of all, a plurality of semiconductor light-emitting elements 1050 having a magnetic material may be formed through the process explained with reference to FIGS. 5A to 5C. In this case, the magnetic material may be deposited onto the semiconductor light-emitting elements in the process of forming the second conductive electrode of FIG. 5C.

Figure 8A:
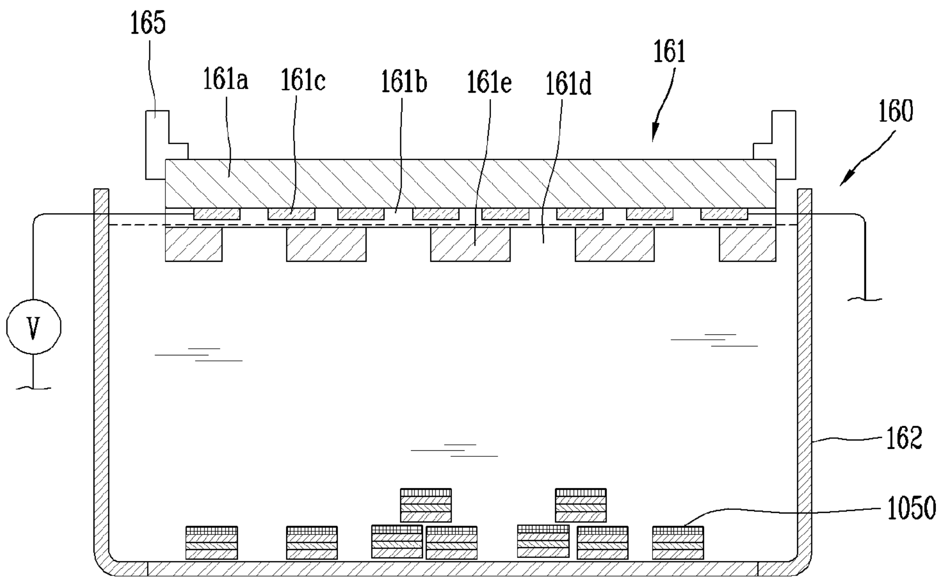
FIGS. 8A to 8E are conceptual views illustrating a process for self-assembling semiconductor light-emitting elements using the self-assembly device of FIG. 6.
Figure 9:
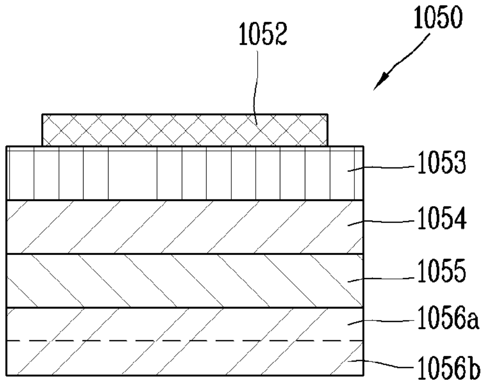
FIG. 9 is a view illustrating one embodiment of a semiconductor light-emitting element that is used in the self-assembly process of FIGS. 8A to 8E.

Next, the substrate 161 may be fed to an assembly site, and the semiconductor light-emitting elements 1050 may be put into the fluid chamber 162 (FIG. 8A).

As described above, the assembly site on the substrate 161 may be a position at which the substrate 161 is placed in the fluid chamber 162 in such a way that an assembly surface where the semiconductor light-emitting elements 150 are assembled faces downwards.

In this case, some of the semiconductor light-emitting elements 1050 may sink to the bottom of the fluid chamber 162 and some of them may float in the fluid. When the fluid chamber 162 is provided with the light-transmissive bottom plate 166, some of the semiconductor light-emitting elements 1050 may sink to the bottom plate 166.

Figure 8B:
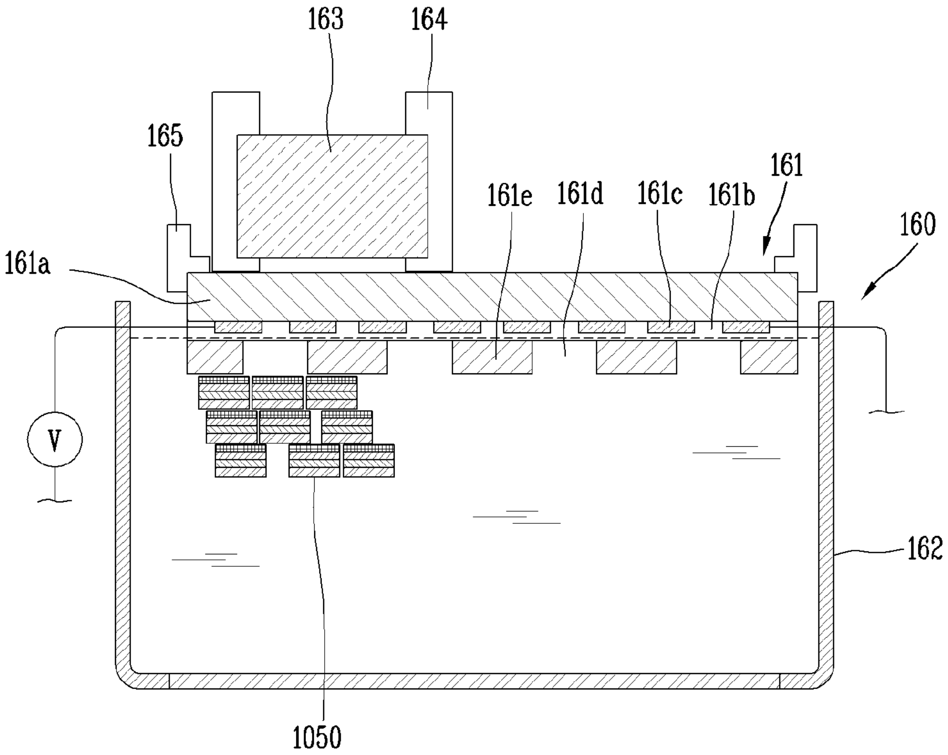

Next, magnetic force may be applied to the semiconductor light-emitting elements 1050 so that the semiconductor light-emitting elements 1050 in the fluid chamber 162 come up to the surface (FIG. 8B).

When the magnet 163 of the self-assembly device moves to the opposite side of the assembly surface of the substrate 161 from its original position, the semiconductor light-emitting elements 1050 may float in the fluid towards the substrate 161. The original position may refer to s position at which the magnet 163 is outside the fluid chamber 162. As another example, the magnet 163 may be configured as an electromagnet. In this case, an initial magnetic force may be generated by supplying electricity to the electromagnet.

Meanwhile, in this implementation, the spacing between the assembly surface of the substrate 161 and the semiconductor light-emitting elements 1050 may be controlled by adjusting strength of the magnetic force. For example, the spacing may be controlled by using weight, buoyancy, and magnetic force of the semiconductor light-emitting elements 1050. The spacing may be several millimeters to several tens of micrometers from the outermost part of the substrate 161.

Figure 8C:
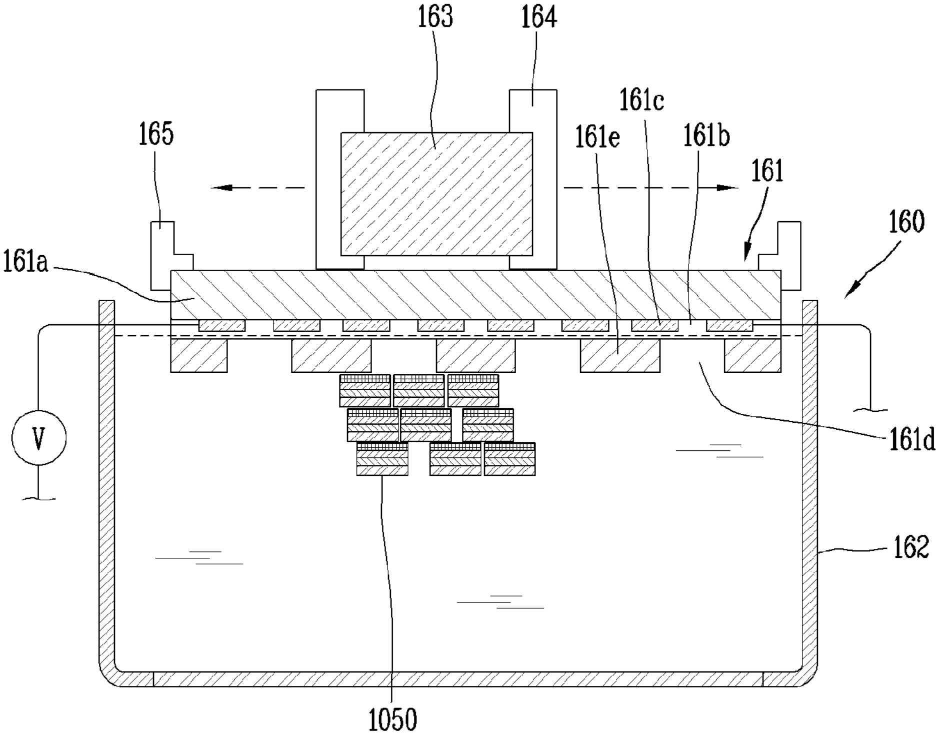

Next, magnetic force may be applied to the semiconductor light-emitting elements 1050 so that the semiconductor light-emitting elements 1050 can move in one direction within the fluid chamber 162. For example, the magnet 163 may move in a horizontal direction to the substrate, a clockwise direction, or a counterclockwise direction (FIG. 8C). In this case, the semiconductor light-emitting elements 1050 may be moved horizontally with respect to the substrate 161 by the magnetic force, with being spaced apart from the substrate 161.

Next, the semiconductor light-emitting elements 1050 may be guided to preset positions on the substrate 161 by applying an electric field so that the semiconductor light-emitting elements 1050 are mounted at the preset positions during their movement (FIG. 8C). For example, the semiconductor light-emitting elements 1050 may be moved vertically with respect to the substrate 161 by the electric field while being moved horizontally with respect to the substrate 161, thereby being placed at the preset positions of the substrate 161.

More specifically, an electric field may be generated by supplying power to bi-planar electrodes on the substrate 161, and the semiconductor light-emitting electrodes 1050 may be guided to be assembled only at the preset positions by the electric field. That is, the semiconductor light-emitting elements 1050 may be self-assembled at the assembly site on the substrate 161 by a selectively generated electric field. To this end, the substrate 161 may be provided with cells into which the semiconductor light-emitting elements 1050 are fitted.

Afterwards, unloading of the substrate 161 may be performed, thereby completing the assembly process. In a case where the substrate 161 is an assembly substrate, the assembled semiconductor light-emitting elements may be transferred onto a wiring substrate to carry out a subsequent process for realizing the display device, as described previously.

Figure 8D:
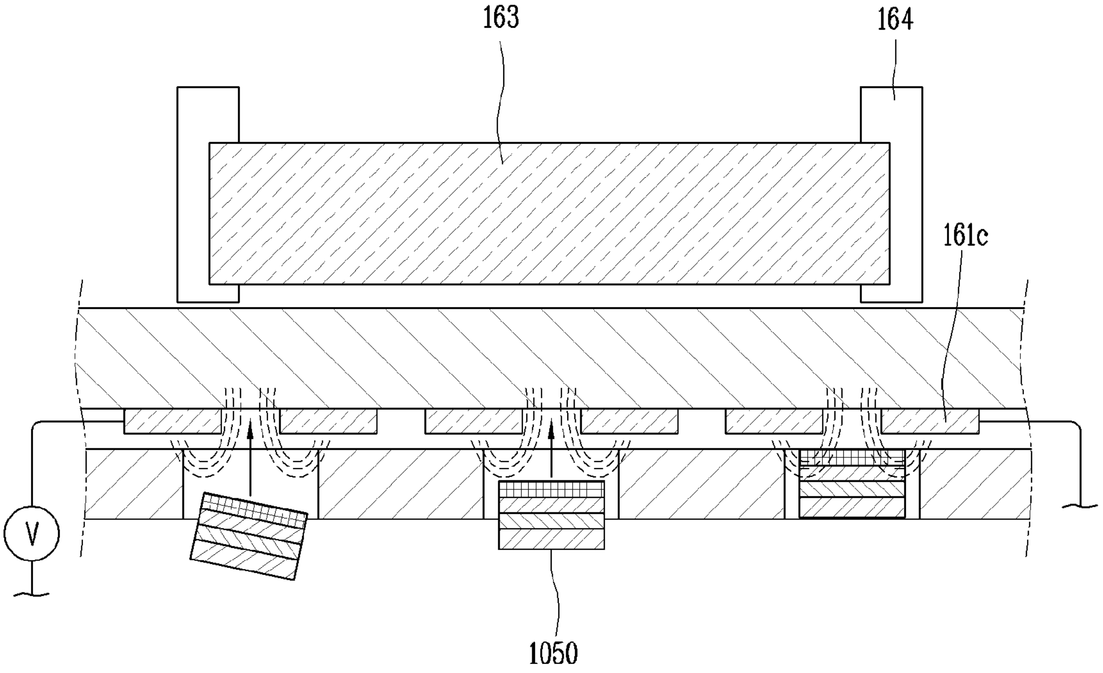
Figure 8E:
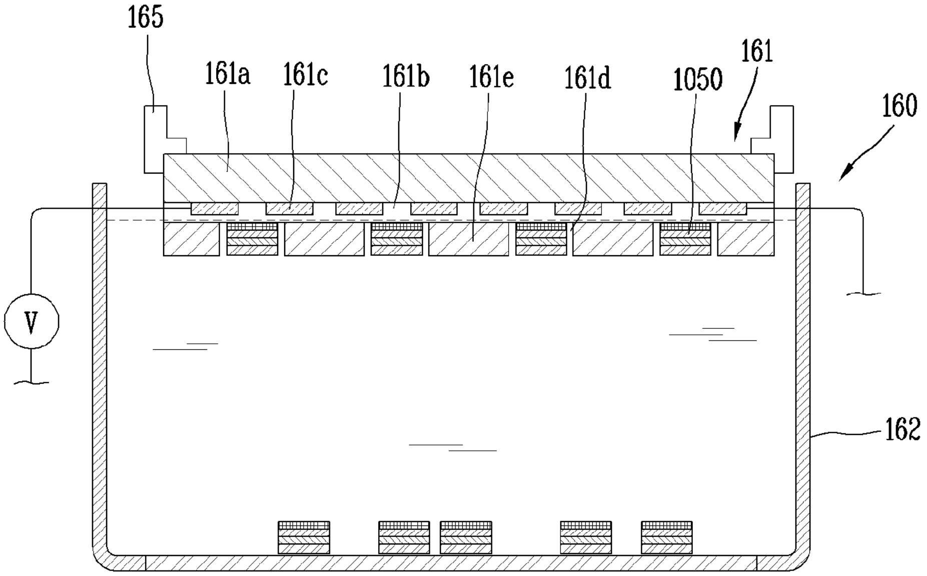

Meanwhile, after the semiconductor light-emitting elements 1050 are guided to the preset positions, the magnet 163 may be moved away from the substrate 161 such that the semiconductor light-emitting elements 1050 remaining in the fluid chamber 162 fall to the bottom of the fluid chamber 162 (FIG. 8D). In another example, when power supply is stopped in a case where the magnet 163 is an electromagnet, the semiconductor light-emitting elements 1050 remaining in the fluid chamber 162 may fall to the bottom of the fluid chamber 162.

Thereafter, the semiconductor light-emitting elements 1050 on the bottom of the fluid chamber 162 may be collected, and the collected semiconductor light-emitting elements 1050 may be reused.

In the above-explained self-assembly device and method, parts at far distances may be concentrated near a preset assembly site by using a magnetic field in order to increase assembly yields in a fluidic assembly, and guided to be selectively assembled only at the assembly site by applying an electric field to the assembly site. In this case, the assembly substrate may be positioned on top of a water tank, with its assembly surface facing downward, thereby minimizing the effect of gravity from the weights of the parts and avoiding non-specific binding and eliminating defects. That is, the assembly substrate may be placed on the top to increase transfer yields, thus minimizing the effect of gravity or friction and avoiding non-specific binding.

As seen from above, with the configuration, a large number of semiconductor light-emitting elements can be assembled at a time in a display device where individual pixels are made up of semiconductor light-emitting elements.

As such, a large number of semiconductor light-emitting elements can be pixelated on a small-sized wafer and then transferred onto a large-area substrate. This enables the manufacture of a large-area display device at a low cost.

Meanwhile, the present disclosure provides a structure and method of an assembly substrate for increasing the yields of the self-assembly process and the process yields after the self-assembly. The present disclosure is limited to a case where the substrate 161 is used as an assembly substrate. That is, the assembly substrate to be described later is not used as the wiring substrate of the display device. Hereinafter, the substrate 161 is referred to as an assembly substrate 161.

The present disclosure improves the process yields in two points of view. First, the present disclosure prevents semiconductor light-emitting elements from being mounted on undesired positions due to an electric field strongly formed at the undesired positions. Second, the present disclosure prevents the semiconductor light-emitting elements from remaining on the assembly substrate when transferring the semiconductor light-emitting elements mounted on the assembly substrate to another substrate.

The above-mentioned objectives are not individually achieved by different components. The above-described two objectives can be achieved by organic coupling of components to be described later and the assembly substrate 161 described above.

Before describing the present disclosure in detail, a post-process for manufacturing a display device after self-assembling will be described.

Figure 10A:
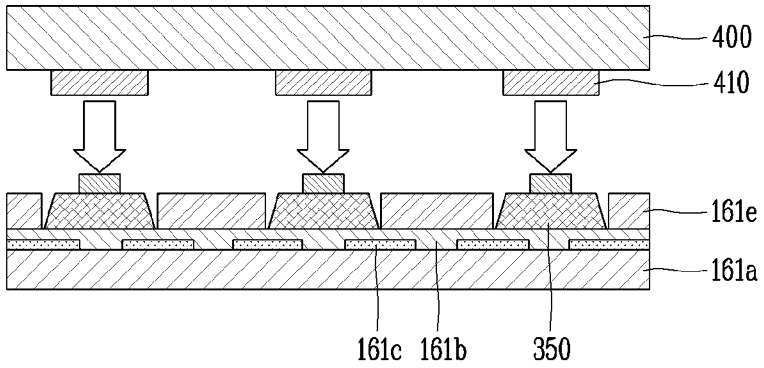
FIGS. 10A to 10C are conceptual views illustrating another transfer process of semiconductor light-emitting elements after a self-assembly process according to the present disclosure.
Figure 10B:
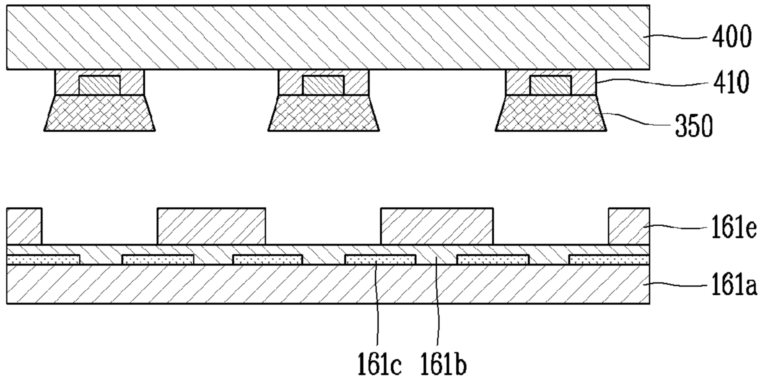
Figure 10C:
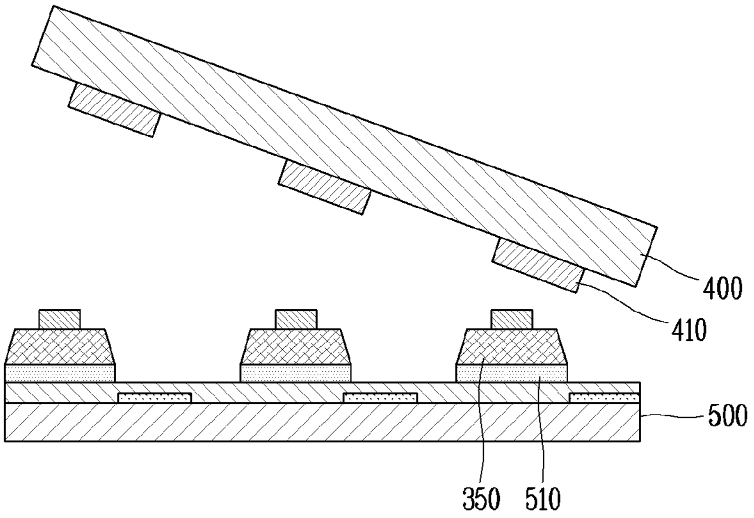

FIGS. 10A to 10C are conceptual diagrams illustrating a state in which the semiconductor light-emitting elements are transferred after a self-assembling process according to the present disclosure.

When the self-assembly process described with reference to FIGS. 8A to 8E is completed, the semiconductor light-emitting elements are mounted on the assembly substrate 161 at preset positions. The semiconductor light-emitting elements mounted on the assembly substrate 161 are transferred at least once to another substrate. This specification illustrates one embodiment in which the semiconductor light-emitting elements mounted on the assembly substrate 161 are transferred twice, but the present disclosure is not limited thereto. The semiconductor light-emitting elements mounted on the assembly substrate 161 may be transferred to another substrate once or three times or more.

On the other hand, immediately after the self-assembly process is completed, the assembly surface of the assembly substrate 161 faces downwards (or the gravity direction).

For the process after the self-assembly, the assembly substrate 161 may be turned by 180 degrees with the semiconductor light-emitting elements mounted thereon. In this process, there is a risk that the semiconductor light-emitting elements are likely to be separated from the assembly substrate 161. Therefore, a voltage must be applied to the plurality of electrodes 161*c* (hereinafter, referred to as assembly electrodes) while the assembly substrate 161 is turned. An electric field formed between the assembly electrodes prevents the semiconductor light-emitting elements from being separated from the assembly substrate 161 while the assembly substrate 161 is turned.

When the assembly substrate 161 is turned by 180 degrees after the self-assembly process, a shape as shown in FIG. 10A is made. Specifically, as shown in FIG. 10A, the assembly surface of the assembly substrate 161 is in a state of facing upwards (or the opposite direction to gravity). In this state, a transfer substrate 400 is aligned above the assembly substrate 161.

The transfer substrate 400 is a substrate for separating the semiconductor light-emitting elements placed on the assembly substrate 161 and transferring them to the wiring substrate. The transfer substrate 400 may be formed of PDMS (polydimethylsiloxane). Accordingly, the transfer substrate 400 may be referred to as a PDMS substrate.

The transfer substrate 400 is aligned above the assembly substrate 161 and then pressed onto the assembly substrate 161. When the transfer substrate 400 is fed above the assembly substrate 161, the semiconductor light-emitting elements 350 mounted on the assembly substrate 161 are transferred to the transfer substrate 400 by the adhesive force of the transfer substrate 400.

To this end, surface energy between the semiconductor light-emitting elements 350 and the transfer substrate 400 should be higher than surface energy between the semiconductor light-emitting elements 350 and the dielectric layer 161*b*. When there is a greater difference between the surface energy between the semiconductor light-emitting elements 350 and the transfer substrate 400 and the surface energy between the semiconductor light-emitting elements 350 and the dielectric layer 161*b*, the probability that the semiconductor light-emitting elements 350 are separated from the assembly substrate 161 is more increased. Therefore, it is preferable that the difference between the two surface energies is great.

Meanwhile, the transfer substrate 40 may include a plurality of protrusions 410 that allow pressure applied by the transfer substrate 400 to be concentrated on the semiconductor light-emitting elements 350 when pressing the transfer substrate 400 onto the assembly substrate 161. The protrusions 410 may be formed at the same interval as the semiconductor light-emitting elements mounted on the assembly substrate 161. When the transfer substrate 400 is pressed onto the assembly substrate 161 after the protrusions 410 are aligned to overlap the semiconductor light-emitting elements 350, the pressure applied by the transfer substrate 400 can be concentrated only on the semiconductor light-emitting elements 350. Thus, the present disclosure increases the probability that the semiconductor light-emitting elements are separated from the assembly substrate 161.

Meanwhile, in a state where the semiconductor light-emitting elements are mounted on the assembly substrate 161, parts of the semiconductor light-emitting elements are preferably exposed to the outside of recesses. If the semiconductor light-emitting elements 350 are not exposed to the outside of the recesses, the pressure applied by the transfer substrate 400 is not concentrated on the semiconductor light-emitting elements 350, which may lower the probability that the semiconductor light-emitting elements 350 are separated from the assembly substrate 161.

Lastly, referring to FIG. 100, the step of pressing the transfer substrate 400 onto the wiring substrate 500 and transferring the semiconductor light-emitting elements 350 from the transfer substrate 400 to the wiring substrate 500 is carried out. At this time, the wiring substrate 500 may be provided with protrusions 510. The transfer substrate 400 and the wiring substrate 500 are aligned so that the semiconductor light-emitting elements 350 disposed on the transfer substrate 400 overlap the protrusions 510. Thereafter, when the transfer substrate 400 is pressed onto the wiring substrate 500, the probability that the semiconductor light-emitting elements 350 are separated from the transfer substrate 400 may increase due to the protrusions 510.

On the other hand, in order for the semiconductor light-emitting elements 350 disposed on the transfer substrate 400 to be transferred to the wiring substrate 500, surface energy between the semiconductor light-emitting elements 350 and the wiring substrate 500 should be higher than surface energy between the semiconductor light-emitting elements 350 and the transfer substrate 400. When there is a greater difference between the surface energy between the semiconductor light-emitting elements 350 and the wiring substrate 500 and the surface energy between the semiconductor light-emitting elements 350 and the transfer substrate 400, the probability that the semiconductor light-emitting elements 350 are separated from the transfer substrate 400 is more increased. Therefore, it is preferable that the difference between the two surface energies is great.

After all the semiconductor light-emitting elements 350 disposed on the transfer substrate 400 are transferred onto the wiring substrate 500, the step of establishing electrical connection between the semiconductor light-emitting elements 350 and wiring electrodes provided on the wiring substrate may be performed. The structure of the wiring electrodes and the method of establishing the electrical connection may vary depending on the type of the semiconductor light-emitting elements 350.

Although not shown, an anisotropic conductive film may be disposed on the wiring substrate 500. In this case, the electrical connection can be established between the semiconductor light-emitting elements 350 and the wiring electrodes formed on the wiring substrate 500, simply by pressing the transfer substrate 400 onto the wiring substrate 500.

On the other hand, when manufacturing a display device including semiconductor light-emitting elements emitting light of different colors, the method described in FIGS. 10A to 10C can be implemented in various ways. Hereinafter, a method for manufacturing a display device including semiconductor light-emitting elements that emit red (R), green (G), and blue (B) light will be described.

Figure 11:
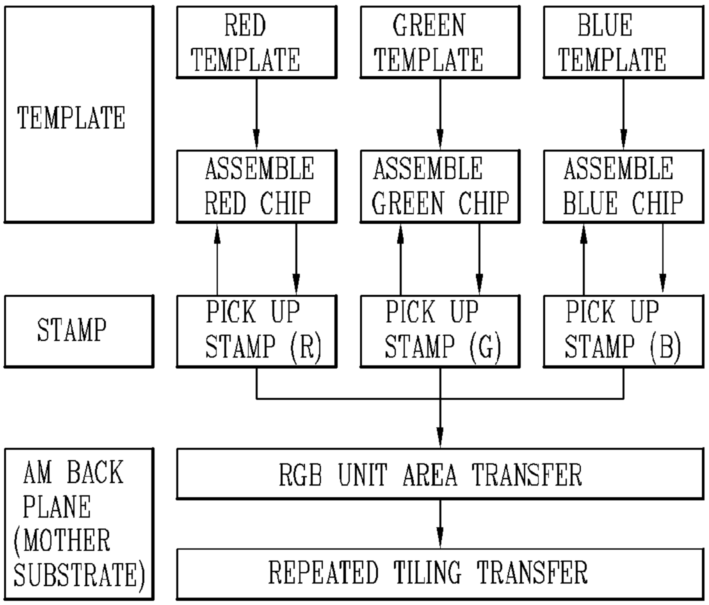
FIGS. 11 to 13 are flowcharts illustrating a method for manufacturing a display device including semiconductor light-emitting elements that emit red (R), green (G), and blue (B) light.
Figure 12:
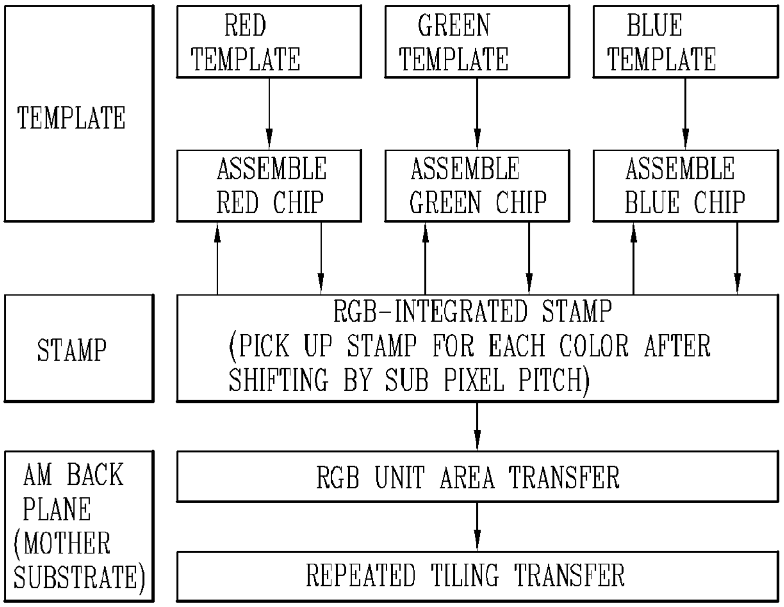
Figure 13:
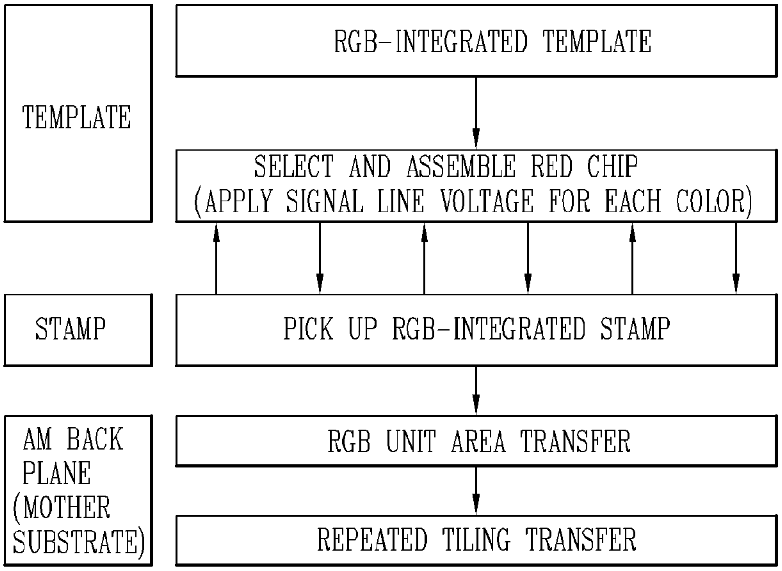

FIGS. 11 to 13 are flowcharts illustrating a method for manufacturing a display device including semiconductor light-emitting elements that emit red (R), green (G), and blue (B) light.

Semiconductor light-emitting elements emitting light of different colors may be individually assembled to different assembly substrates. Specifically, the assembly substrate 161 may include a first assembly substrate on which semiconductor light-emitting elements emitting light of a first color are mounted, a second assembly substrate on which semiconductor light-emitting elements emitting light of a second color different from the first color are mounted, and a third assembly substrate on which semiconductor light-emitting elements emitting light of a third color different from the first color and the second color are mounted. Different kinds of semiconductor light-emitting elements are assembled to assembly substrates, respectively, according to the method described in FIGS. 8A to 8E. For example, semiconductor light-emitting elements emitting red (R), green (G), and blue (B) light may be assembled to the first to third assemble substrates, respectively.

Referring to FIG. 11, a RED chip, a GREEN chip, and a BLUE chip may be assembled respectively to first to third assembly substrates RED TEMPLATE, GREEN TEMPLATE, and BLUE TEMPLATE. In this state, the RED chip, GREEN chip and BLUE chip may be transferred to the wiring substrate by different transfer substrates, respectively.

Specifically, the step of transferring the semiconductor light-emitting elements, which are mounted on the assembly substrate, to the wiring substrate may include pressing a first transfer substrate (stamp R) onto the first assembly substrate RED TEMPLATE to transfer the semiconductor light-emitting elements (RED chip) emitting the light of first color from the first assembly substrate RED TEMPLATE to the first transfer substrate (stamp R), pressing a second transfer substrate (stamp G) onto the second assembly substrate GREEN TEMPLATE to transfer semiconductor light-emitting elements (GREEN chip) emitting the light of second color from the second assembly substrate GREEN TEMPLATE to the second transfer substrate (stamp G), and pressing a third transfer substrate (stamp B) onto the third assembly substrate BLUE TEMPLATE to transfer semiconductor light-emitting elements (BLUE chip) emitting the light of third color from the third assembly substrate BLUE TEMPLATE to the third transfer substrate (stamp B).

Thereafter, the step of pressing the respective first to third transfer substrates onto the wiring substrate to transfer the semiconductor light-emitting elements emitting the light of first to third colors from the first to third transfer substrates to the wiring substrate, respectively.

According to the manufacturing method according to FIG. 11, three types of assembly substrates and three types of transfer substrates are required to manufacture a display device including a RED chip, a GREEN chip, and a BLUE chip.

On the contrary, referring to FIG. 12, the RED chip, the GREEN chip, and the BLUE chip may be assembled to the first to third assembly substrates RED TEMPLATE, GREEN TEMPLATE, and BLUE TEMPLATE, respectively. In this state, the RED chip, GREEN chip and BLUE chip may be transferred to the wiring substrate by the same transfer substrate.

Specifically, the step of transferring the semiconductor light-emitting elements, which are mounted on the assembly substrate, to the wiring substrate may include pressing a transfer substrate (RGB integrated stamp) onto the first assembly substrate RED TEMPLATE to transfer the semiconductor light-emitting elements (RED chip) emitting the light of first color from the first assembly substrate RED TEMPLATE to the transfer substrate (RGB integrated stamp), pressing the transfer substrate (RGB integrated stamp) onto the second assembly substrate GREEN TEMPLATE to transfer semiconductor light-emitting elements (GREEN chip) emitting the light of second color from the second assembly substrate GREEN TEMPLATE to the transfer substrate (RGB integrated stamp), and pressing the transfer substrate (RGB integrated stamp) onto the third assembly substrate BLUE TEMPLATE to transfer semiconductor light-emitting elements (BLUE chip) emitting the light of third color from the third assembly substrate BLUE TEMPLATE to the transfer substrate (RGB integrated stamp).

In this case, the alignment positions between each of the first to third assembly substrates and the transfer substrate may be different from each other. For example, when the alignment between the assembly substrates and the transfer substrate is completed, the relative position of the transfer substrate with respect to the first assembly substrate and the relative position of the transfer substrate with respect to the second assembly substrate may be different from each other. The transfer substrate may be shifted in its alignment position by a pitch of a sub pixel every time the type of the assembly substrate is changed. In this way, when the transfer substrate is sequentially pressed onto the first to third assembly substrates, all the three kinds of chips can be transferred to the transfer substrate.

Afterwards, similar to FIG. 11, the step of pressing the transfer substrate onto the wiring substrate to transfer the semiconductor light-emitting elements emitting the light of first to third colors from the transfer substrate to the wiring substrate is performed.

According to the manufacturing method illustrated in FIG. 12, three types of assembly substrates and one type of transfer substrate are required to manufacture a display device including an RED chip, a GREEN chip, and a BLUE chip.

Unlike FIGS. 11 and 12, according to FIG. 13, a RED chip, a GREEN chip, and a BLUE chip may be assembled onto one assembly substrate (RGB integrated TEMPLATE). In this state, each of the RED chip, GREEN chip and BLUE chip can be transferred to the wiring substrate by the same transfer substrate (RGB integrated stamp).

According to the manufacturing method illustrated in FIG. 13, one type of assembly substrate and one type of transfer substrate are required to manufacture a display device including an RED chip, a GREEN chip, and a BLUE chip.

As described above, when manufacturing a display device including semiconductor light-emitting elements emitting light of different colors, the manufacturing method may be implemented in various ways.

The present disclosure relates to an assembly substrate (hereinafter, a substrate for manufacturing a display device) of a new structure used in a method of manufacturing a display device (hereinafter, a hybrid method) that goes through the processes of FIGS. 10 to 13 and a manufacturing method thereof.

A substrate for manufacturing a display device may refer to a substrate on which semiconductor light-emitting elements are transferred through the self-assembly method illustrated in FIGS. 8A to 8E in a hybrid method. A substrate for manufacturing a display device may include components for self-assembly, and may be distinguished from a wiring substrate on which wires for turning on or off semiconductor light-emitting elements are disposed.

Hereinafter, a structure of a substrate for manufacturing a display device according to the present disclosure will be described with reference to FIGS. 14 and 15.

Figure 14:
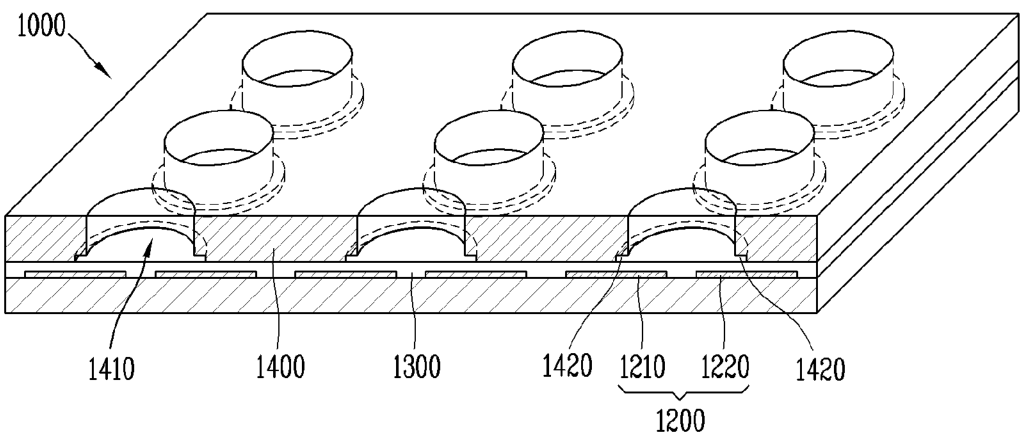
FIG. 14 is a view illustrating a substrate for manufacturing a display device in accordance with one embodiment.
Figure 15:
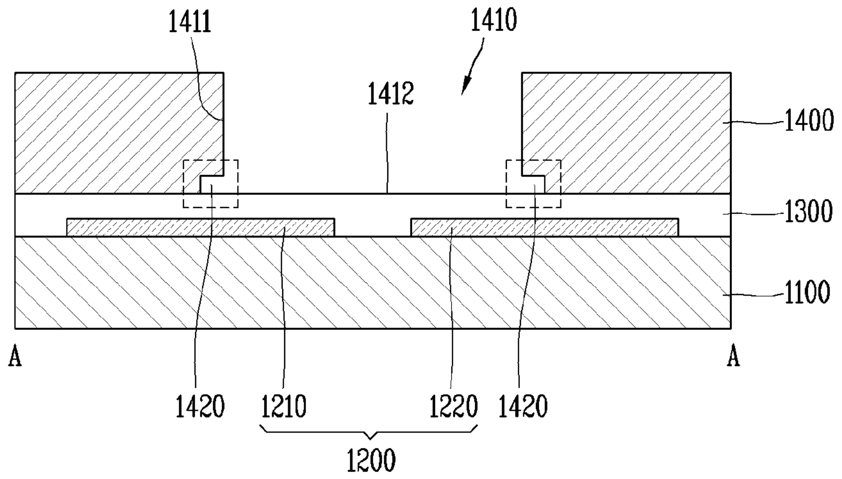
FIG. 15 is a view illustrating a cross-section of an inside of an assembly hole of the substrate according to FIG. 14.

FIG. 14 is a view illustrating a substrate for manufacturing a display device in accordance with one embodiment, and FIG. 15 is a view illustrating a cross-section of an inside of an assembly hole of the substrate according to FIG. 14.

According to the present disclosure, a substrate 1000 for manufacturing a display device may include a base 1100, assembly electrodes 1200, a dielectric layer 1300, and a barrier rib 1400. In addition, the barrier rib 1400 may include grooves 1420 formed by removing a metal pattern 1500 for protecting the assembly electrodes 1200 and the dielectric layer 1300 during the manufacturing process.

The base 1100 may be a flexible substrate or a rigid substrate made of an insulating material. For example, the base 1100 may be made of a material, such as polyimide (PI), glass, or the like.

The assembly electrodes 1200 may be formed (or disposed) at predetermined distances on the base 1100. The assembly electrodes 1200 may be bar-shaped electrodes extending in one direction. The assembly electrodes 1200 may be disposed parallel to one another on the base 1100 and two adjacent assembly electrodes 1200 may define a pair of pair electrodes 1210 and 1220. A distance between the pair electrodes 1210 and 1220 may be determined depending on a diameter (or size) of the semiconductor light-emitting element. The pair electrodes 1210 and 1220 may preferably be disposed at a gap corresponding to 10% to 30% of the diameter of the semiconductor light-emitting element.

The assembly electrodes 1200 are provided for self-assembly. During the self-assembly, a voltage may be applied to the assembly electrodes 1200 to form an electric field. Specifically, an AC voltage may be applied to the pair electrodes 1210 and 1220 to form an electric field between the pair electrodes.

The assembly electrodes 1200 may be formed of a non-resistive metal or a material having excellent electrical conductivity so as to be advantageous in voltage transmission. For example, each of the assembly electrodes 1200 may include a plurality of layers that metal materials such as Mo/Al/Mo, Ti/Al/Ti, Ti/Cu/Ti, and the like are stacked. The assembly electrodes 1200 each may have a thickness of 50 nm to 300 nm.

The dielectric layer 1300 may be disposed to cover the assembly electrodes 1200 on the base 1100. The dielectric layer 1300 may protect the assembly electrodes 1200 from a fluid in which the self-assembly is performed. In addition, the dielectric layer 1300 may prevent an abnormal current (fault current) from flowing due to exposure of the assembly electrodes 1200 to the fluid during the self-assembly.

The dielectric layer 1300 may be formed of an inorganic insulating material such as SiO2, SiNx or Al2O3. In addition, the dielectric layer 1300 cannot protect the assembly electrodes 1200 when it is formed too thin. On the hand, the dielectric layer 1300 may weaken an assembling force of the semiconductor light-emitting elements when it is formed too thick. Thus, the dielectric layer 1300 may have a thickness of 50 nm to 200 nm.

The barrier rib 1400 may be deposited on the dielectric layer 1300. The barrier rib 1400 may include assembly holes 1410 to overlap the assembly electrodes 1200 and may be stacked on the dielectric layer 1300. Since the assembly holes 1410 are formed to overlap the pair electrodes 1210 and 1220 at the same time, an electric field may be formed in the assembly holes 1410 when a voltage is applied to the assembly electrodes 1200, and the semiconductor light-emitting elements may be seated in the assembly holes 1410 by a dielectrophoretic force.

In the present disclosure, the semiconductor light-emitting elements seated in the assembly holes 1410 may have a structure to be self-assembled. The semiconductor light-emitting elements may have horizontal or vertical structures with a circular or elliptical shape that is symmetrical in at least one direction, and may include a magnetic substance to be induced by a magnetic force. The magnetic substance may be included in a conductive electrode constituting the semiconductor light-emitting element in various forms. Description of other components of the semiconductor light-emitting element will be replaced with the previous description.

According to the present disclosure, the barrier rib 1400 may be formed of an inorganic insulating material, and for example, may be made of SiO2 or SiNx.

Meanwhile, according to the present disclosure, the barrier rib 1400 may include grooves 1420 formed in a surface defining an inner surface 1411 of the assembly hole 1410 as illustrated in FIGS. 14 and 15. The grooves 1420 may have a structure formed by removing a metal pattern 1500 for protecting the assembly electrodes 1200 and the dielectric layer 1300 during the process of manufacturing the substrate 1000 for manufacturing the display device.

Since the metal pattern 1500 is removed after being formed on the dielectric layer 1300, the grooves 1420 may be formed in the dielectric layer 1300, that is, in a bottom surface 1412 of the assembly hole 1410. In addition, the metal pattern 1500 may be formed in the same shape as the assembly hole 1410, for example, in a circular or elliptical pattern. At this time, since the metal pattern 1500 is formed with a larger area than the assembly hole 1410 while having the same center as the assembly hole 1410, the groove 1420 may be formed with a predetermined width along a circumference of the assembly hole 1410. The width of the groove 1420 may be determined according to a difference in area between the assembly hole 1410 and the metal pattern 1500.

In addition, the metal pattern 1500 may be formed on the dielectric layer 1300 to have a thickness of 20 nm to 200 nm, and the groove 1420 may have a thickness (or height) of 20 nm to 200 nm from the bottom surface 1412 of the assembly hole 1410.

Hereinafter, a method of manufacturing the substrate 1000 for manufacturing a display device according to the present disclosure will be described.

First, problems of the related art substrate for manufacturing a display device will be described with reference to FIGS. 16 and 17.

Figure 16:
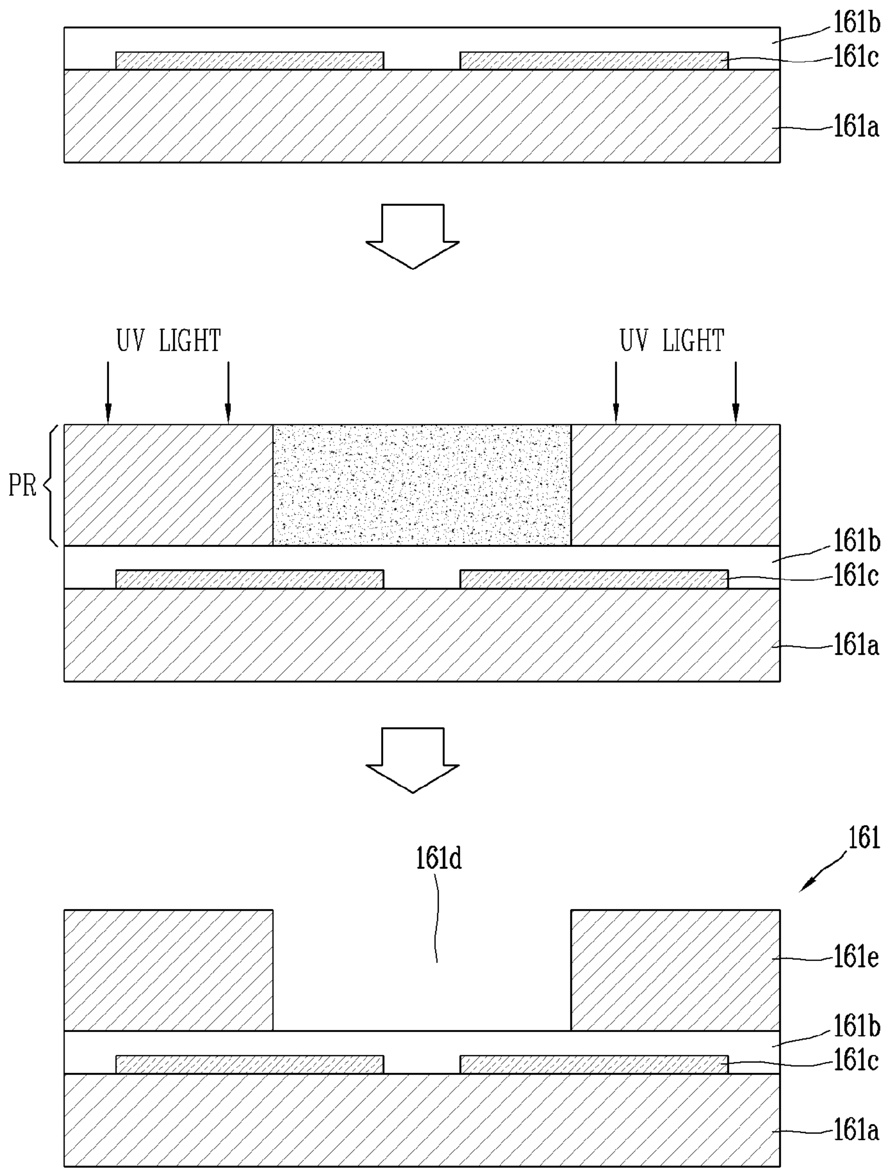
FIG. 16 is a view illustrating a method of manufacturing a substrate for manufacturing a display device according to one embodiment of the related art.
Figure 17:
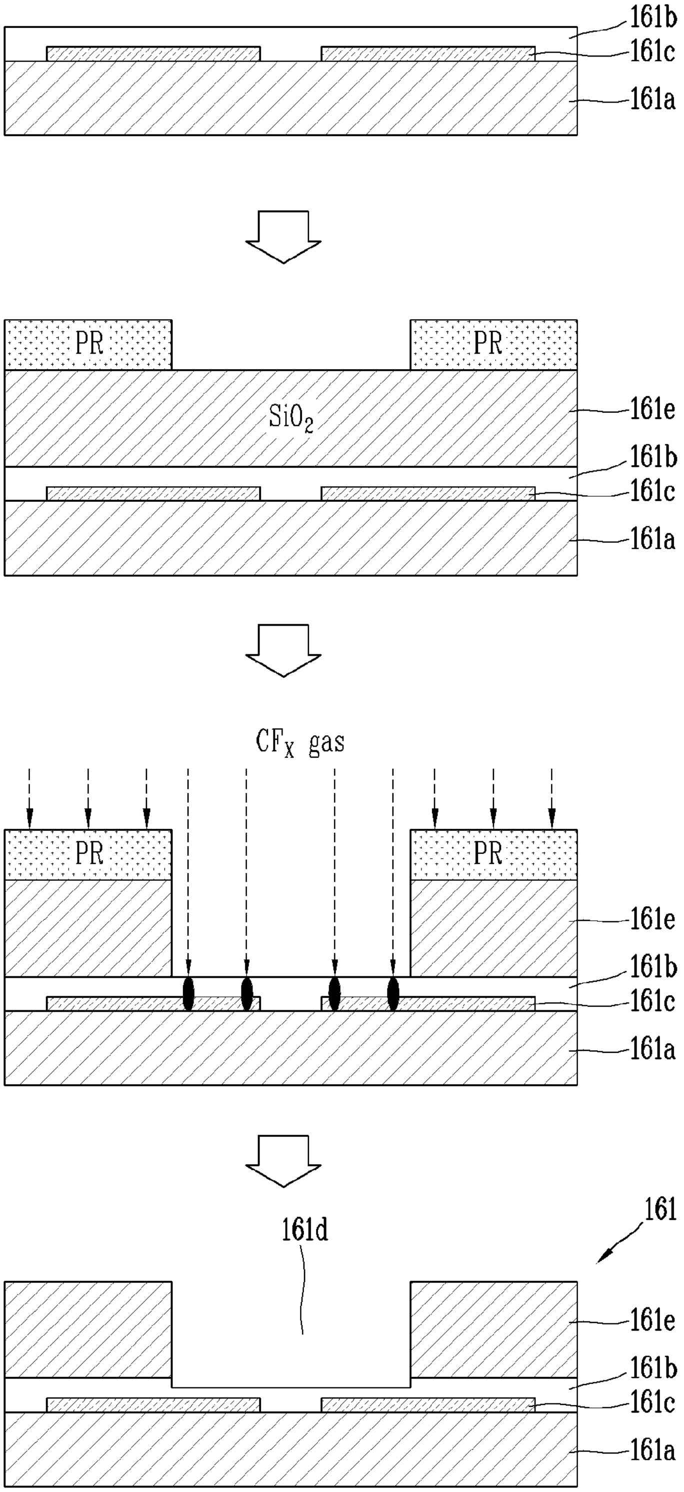
FIG. 17 is a view illustrating a method of manufacturing a substrate for manufacturing a display device according to another embodiment of the related art.

FIG. 16 is a view illustrating a method of manufacturing a substrate for manufacturing a display device according to one embodiment of the related art, and FIG. 17 is a view illustrating a method of manufacturing a substrate for manufacturing a display device according to another embodiment of the related art.

FIG. 16 illustrates an embodiment in which a barrier rib 161*e* is formed of an organic material in the related art substrate 161 for manufacturing the display device.

Referring to FIG. 16, after assembly electrodes 161*c* and a dielectric layer 161*b* to cover the assembly electrodes 161*c* are formed on a base 161*a*, a barrier rib 161*e* may be formed on the dielectric layer 161*b*.

In FIG. 16, a photosensitive polymer (photoresist (PR)) may be used to form the barrier rib 161*e*. A cured portion through a photolithography process defines the barrier rib 161*e* and an uncured portion is removed to form an assembly hole 161*d*.

The photoresist can be easily laminated with a thickness of several μm and only an uncured portion of the photoresist can be selectively removed by using a developer. However, the photoresist has a limitation in reuse due to weak durability, such as being easily damaged during a stamping process, an organic cleaning process, and the like.

FIG. 17 illustrates an embodiment in which the barrier rib 161*e* is formed of an inorganic material in the related art substrate 161 for manufacturing the display device.

Referring to FIG. 17, after forming the assembly electrodes 161*c* on the base 161*a* and the dielectric layer 161*b* to cover the assembly electrodes 161*c*, the barrier rib 161*e* may be formed on the dielectric layer 161*b*.

According to FIG. 17, an inorganic insulating material such as SiO2 may be used instead of the photoresist (PR) to form the barrier rib 161*e*. The inorganic material such as SiO2 or the like is not damaged even by organic cleaning and has high durability.

Meanwhile, when the barrier rib 161*e* is formed of an inorganic insulating material, a PR mask pattern is formed on the inorganic insulating material and then the assembly holes 161*d* are formed through dry etching. However, the dry etching has a problem in that etching does not occur uniformly, and thereby, some assembly holes 161*d* are over-etched, which may cause physical and chemical damage on the dielectric layer 161*b* and the assembly electrodes 161*c* that are disposed below the barrier rib 161*e*. In particular, when the dielectric layer 161*b* and the assembly electrodes 161*c* are damaged due to over-etching, an electric field is distorted during self-assembly, resulting in lowering an assembling force of the semiconductor light-emitting elements, such as assembling the semiconductor light-emitting elements abnormally.

The substrate 1000 for manufacturing a display device according to the present disclosure is to solve the aforementioned problems, and is characterized in view of forming the metal pattern 1500 before forming the barrier rib 1400 on the dielectric layer 1300.

FIGS. 18A to 18E are views for explaining a process of manufacturing a substrate for manufacturing a display device according to one embodiment of the present disclosure.

Figure 18A:
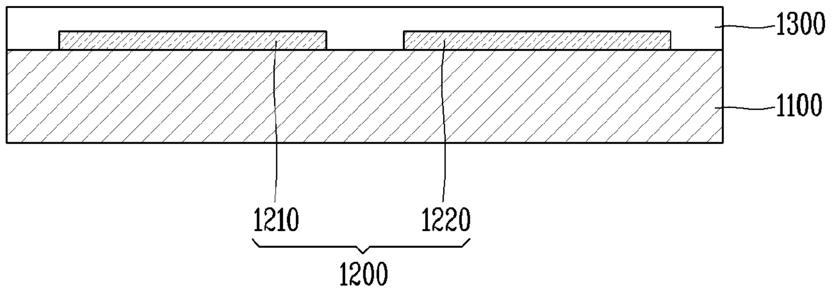
FIGS. 18A to 18E are views for explaining a process of manufacturing a substrate for manufacturing a display device according to one embodiment of the present disclosure.

First, in order to manufacture a substrate 1000 for manufacturing a display device according to the present disclosure, first, as illustrated in FIG. 18A, assembly electrodes 1200 and a dielectric layer 1300 covering the assembly electrodes 1200 may be formed on a base 1100.

Patterns for forming the assembly electrodes 1200 may be formed on the base 1100 at predetermined distances by atomic layer deposition (ALD), sputtering, E-beam deposition, electroplating, or the like. The assembly electrodes 1200 are bar-shaped electrodes extending in one direction, and may be disposed parallel to one another.

In particular, two assembly electrodes disposed adjacent to each other may form a pair of pair electrodes 1210 and 1220. When circular semiconductor light-emitting elements are transferred to the substrate 1000 for manufacturing a display device according to the present disclosure, the pair of pair electrodes 1210 and 1220 may be disposed at a distance(gap) corresponding to 10% to 30% of a diameter of the semiconductor light-emitting element. For example, when the diameter of the semiconductor light-emitting element is 50 μm, the pair electrodes 1210 and 1220 may be disposed at a distance of 5 μm to 15 μm therebetween.

The dielectric layer 1300 may be formed on the base 1100 to cover the assembly electrodes 1200. For example, the dielectric layer 1300 may be deposited by a thickness of tens to hundreds of nm through PVD, CVD, or the like, and may preferably be deposited by a thickness of 50 nm to 200 nm.

Figure 18B:
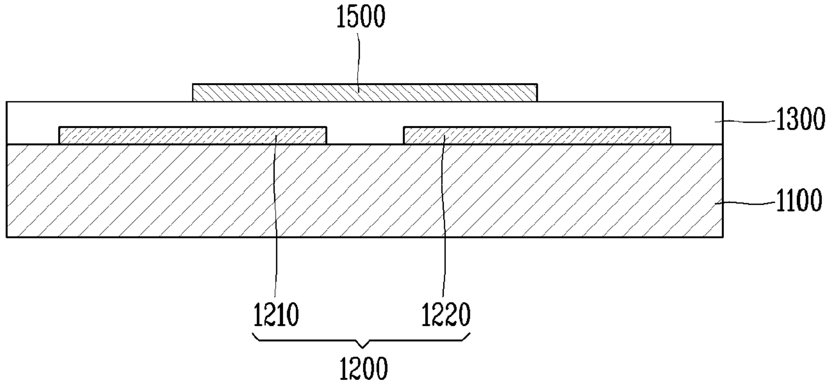

Next, as illustrated in FIG. 18B, a metal pattern 1500 may be formed on the dielectric layer 1300. The metal pattern 1500 may be formed to overlap the assembly electrodes 1200, specifically, the pair of pair electrodes 1210 and 1220.

The metal patterns 1500 may refer to a plurality of patterns formed at positions where assembly holes 1410 to be described later are formed. The plurality of patterns may be formed in a matrix configuration consisting of a plurality of rows and columns.

The metal pattern 1500 may be formed to prevent the assembly electrodes 1200 from being exposed through the assembly hole 1410 due to over-etching of the dielectric layer 1300 when the assembly hole 1410 is formed by dry etching.

Figure 19:
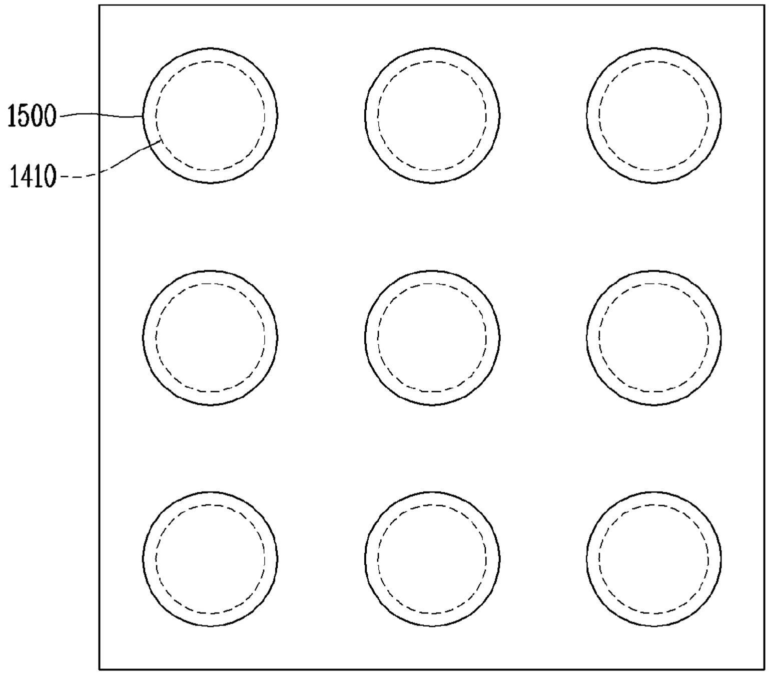
FIG. 19 is a view illustrating a state in which metal patterns and assembly holes are viewed from a top of a substrate according to the present disclosure.

To this end, the metal pattern 1500 may be formed to share a center with the assembly hole 1410 and may have a larger area than the assembly hole 1410. For example, the metal pattern 1500 may have an area that is 5% to 10% wider area than that of the assembly hole 1410. In addition, the metal pattern 1500 and the assembly hole 1410 may be formed in the same shape, for example, in a circular or elliptical shape. The above matters will be confirmed through FIG. 19.

The metal pattern 1500 may be deposited by a thickness of 20 nm to 200 nm through atomic layer deposition (ALD), sputtering, E-beam deposition, or the like. If the metal pattern 1500 is formed too thin, it cannot properly serve to protect the dielectric layer 1300, etc., and if it is formed too thick, a surrounding structure such as the barrier rib 1400 may be etched together when the metal pattern 1500 is removed later.

In addition, the metal pattern 1500 may be formed of a metal material having an etching selectivity of 10:1 or more with the barrier rib 1400 for a CFx-based etching gas to protect the dielectric layer 1300 and the assembly electrodes 1200. For example, the metal pattern 1500 may be formed of Al, Cr, or an alloy (e.g., NiCr, etc.) containing any one of them, and may have a multilayered structure including any one of those metals (e.g., Mo/Al/Mo, Ti/Al/Ti, etc.).

Figure 18C:
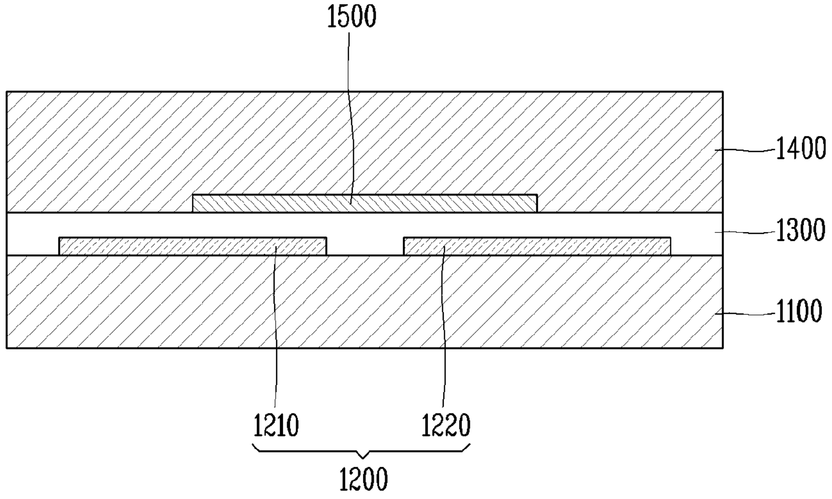
Figure 18D:
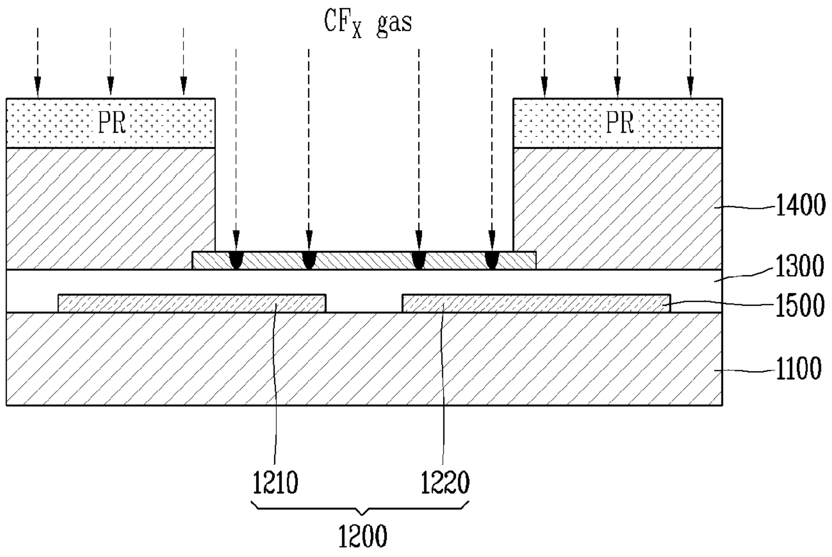

Next, as illustrated in FIGS. 18C and 18D, after forming the barrier rib 1400 to cover the metal pattern 1500 on the dielectric layer 1300, the assembly hole 1410 may be formed to overlap the metal pattern 1500.

According to the present disclosure, the barrier rib 1400 may be formed of an inorganic insulating material, for example, SiO2 or SiNx for durability of the substrate, and may be deposited on the dielectric layer 1300 by a maximum thickness of several to through PVD or CVD.

Next, after applying the PR, a PR mask pattern is formed through a photolithography process, and dry etching (e.g., RIE, ICP, etc.) may be performed to form the assembly hole 1410. In detail, the barrier rib 1400 may be etched using a CFx-based etching gas, through which the assembly hole 1410 can be formed. At this time, as described above, since the metal pattern 1500 is formed of a metal material that has an etching selectivity of 10:1 or more with the barrier rib 1400 for the CFx-based etching gas, the metal pattern 1500 in this step may not be etched but exposed through the assembly hole 1410. That is, in this step, the metal pattern 1500 may absorb both physical and chemical damages occurred during the dry etching, and thus the dielectric layer 1300 can be protected.

Figure 18E:
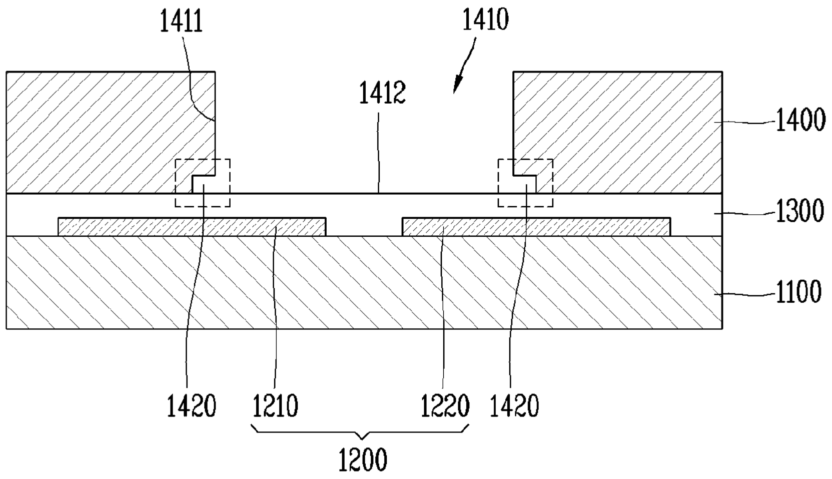

Finally, the metal pattern 1500 exposed through the assembly hole 1410 may be removed, and the structure illustrated in FIG. 18E can be obtained. The metal pattern 1500 exposed through the assembly hole 1410 may be removed using a $Cl_2$-based etching gas or through wet etching. During this process, damage may not be caused on the dielectric layer 1300 disposed below the metal pattern 1500.

Meanwhile, as the metal pattern 1500 having a larger area than the assembly hole 1410 is removed, the groove 1420 may be formed in the barrier rib 1400. In detail, the groove 1420 may be formed in a surface defining the inner surface 1411 of the assembly hole 1410 of the barrier rib 1400, and simultaneously formed on the dielectric layer 1300 corresponding to the bottom surface 1412 of the assembly hole 1410. In addition, since the metal pattern 1500 has the same shape as the assembly hole 1410 and is formed to share a center with the assembly hole 1410, the groove 1420 may have a predetermined width along the circumference of the assembly hole 1410. In this case, the width of the groove 1420 may depend on a difference in area from the assembly hole 1410.

In the substrate 1000 for manufacturing a display device according to the present disclosure, the metal pattern 1500 can be formed during the manufacturing process, to prevent the dielectric layer 1300 and the assembly electrodes 1200 from being damaged due to etching gas when the assembly hole 1410 is formed. Accordingly, the substrate 1000 can be reused so as to secure productivity and cost competitiveness.

The foregoing description is merely illustrative to explain the technical idea of the present disclosure, and it will be apparent to those skilled in the art that various modifications and variations can be made without departing from the essential characteristics of the present disclosure.

Therefore, the embodiments disclosed in the present disclosure are illustrative rather than being intended to limit the technical spirit of the present disclosure, and the scope of the technical spirit of the present disclosure is not limited by these embodiments.

The scope of the present disclosure should be construed according to the claims below, and all technical ideas within the scope equivalent thereto should be construed as being included in the scope of the present disclosure.

The invention claimed is:

1. A method for manufacturing a substrate for manufacturing a display device, the method comprising:

(a) forming assembly electrodes extending in one direction on a base at predetermined distances, and forming a dielectric layer to cover the assembly electrodes;

(b) forming metal patterns on the dielectric layer to overlap the assembly electrodes;

(c) forming a barrier rib on the dielectric layer to cover the metal patterns, and then forming assembly holes to overlap the metal patterns, wherein each of the metal patterns shares a center with the assembly hole, and the metal pattern is formed to have an area wider than that of the assembly hole; and (d) removing all of the metal patterns exposed through the assembly holes, wherein in the step (d), all of the metal patterns are removed such that grooves are formed in a surface of the barrier rib defining inner surfaces of the assembly holes.

2. The method of claim 1, wherein each of the grooves is formed with a predetermined width along a circumference of the assembly hole.

3. The method of claim 1, wherein in the step (b), each of the metal patterns is formed with a thickness of 20 nm to 200 nm on the dielectric layer.

4. The method of claim 1, wherein the barrier rib is formed of $SiO_2$ or $SiN_x$, and wherein in the step (c), the barrier rib is etched using a $CF_x$-based etching gas to form the assembly holes.

5. The method of claim 4, wherein the metal pattern is formed of a metal material having an etching selectivity of 10:1 or more with the barrier rib for the $CF_x$-based etching gas.

6. The method of claim 1, wherein in step (d), the metal pattern is removed through dry etching using a $Cl_2$-based etching gas or wet etching.

7. The method of claim 1, wherein, as the metal patterns exposed through the assembly holes are removed, damage is not caused on the dielectric layer disposed below the metal patterns, thereby allowing repeated use of the substrate for manufacturing the display device.

* * * * *